United States Patent
Hashiguchi et al.

(10) Patent No.: US 10,429,638 B2
(45) Date of Patent: Oct. 1, 2019

(54) CONTROL UNIT, OPTICAL DEFLECTION SYSTEM, IMAGE PROJECTION APPARATUS, AND CONTROL METHOD

(71) Applicant: RICOH COMPANY, LTD., Tokyo (JP)

(72) Inventors: Tsuyoshi Hashiguchi, Kanagawa (JP); Jun Nakagawa, Kanagawa (JP); Shuichi Suzuki, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 196 days.

(21) Appl. No.: 15/459,208

(22) Filed: Mar. 15, 2017

(65) Prior Publication Data
US 2017/0269352 A1  Sep. 21, 2017

(30) Foreign Application Priority Data

Mar. 17, 2016 (JP) ................. 2016-053673
Feb. 14, 2017 (JP) ................. 2017-025044

(51) Int. Cl.
*G02B 26/08* (2006.01)
*G02B 26/10* (2006.01)
(Continued)

(52) U.S. Cl.
CPC ....... *G02B 26/0858* (2013.01); *G02B 26/101* (2013.01); *G02B 26/105* (2013.01); *G03B 21/008* (2013.01); *H01L 41/042* (2013.01); *H01L 41/0953* (2013.01); *H04N 1/047* (2013.01); *H04N 3/08* (2013.01); *G02B 27/0031* (2013.01)

(58) Field of Classification Search
CPC .............. G02B 26/105; G02B 26/0833; G02B 26/0841; G02B 26/08; G01S 7/4817
See application file for complete search history.

(56) References Cited

U.S. PATENT DOCUMENTS 5,661,591 A    8/1997  Lin et al.
9,910,271 B2 *  3/2018  Kitazawa ............. G02B 26/105
(Continued)

FOREIGN PATENT DOCUMENTS

CN    103246059 A    8/2013
EP    2891917 A1     7/2015
(Continued)

OTHER PUBLICATIONS

European search report dated Aug. 1, 2017 in connection with corresponding European patent application No. 17159436.9.
(Continued)

*Primary Examiner* — William R Alexander
*Assistant Examiner* — Tamara Y. Washington
(74) *Attorney, Agent, or Firm* — Oblon, McClelland, Maier & Neustadt, L.L.P.

(57) ABSTRACT

A control unit to control a movement of a reflector includes a drive signal output unit to apply a drive voltage having a minimum value and a maximum value in one cycle to a piezoelectric element to deform the piezoelectric element, the deformation of the piezoelectric element causing the reflector to move, and circuitry to control the drive voltage to have the minimum value greater than a zero voltage by a given difference value.

15 Claims, 17 Drawing Sheets

(51) Int. Cl.
*G02B 26/12* (2006.01)
*G03B 21/00* (2006.01)
*H04N 3/08* (2006.01)
*H01L 41/04* (2006.01)
*H04N 1/047* (2006.01)
*H01L 41/09* (2006.01)
*G02B 27/00* (2006.01)

(56) References Cited

U.S. PATENT DOCUMENTS

| | | |
|---|---|---|
| 2007/0127111 A1 | 6/2007 | Hashiguchi et al. |
| 2010/0014073 A1 | 1/2010 | Hashiguchi et al. |
| 2015/0077823 A1 | 3/2015 | Hashiguchi et al. |
| 2016/0109697 A1 | 4/2016 | Nakagawa et al. |

FOREIGN PATENT DOCUMENTS

| | | |
|---|---|---|
| EP | 2962984 A1 | 1/2016 |
| JP | 2011-107505 | 6/2011 |
| JP | 2015-055829 | 3/2015 |
| JP | 2015-057625 | 3/2015 |
| JP | 2015-129801 | 7/2015 |

OTHER PUBLICATIONS

Chen Wei et al. "A compact two-dimensional laser scanner based on piezoelectric actuators", Rev. Sci. Instrum., 86 (1), pp. 013102-1 thru 013102-8 (2015).

V. V. Shvartsman et al. "Nonlinear local piezoelectric deformation in ferroelectric thin films studied by scanning force microscopy", J. Appl. Phys., pp. 104105-1 thru 104105-11 (2005).

Dec. 27, 2018 Chinese official action in connection with corresponding Chinese patent application No. 201710136971.2.

\* cited by examiner

WHEN VOLTAGE IS APPLIED TO FIRST PIEZOELECTRIC DRIVE UNIT A ALONE

WHEN VOLTAGE IS APPLIED TO FIRST PIEZOELECTRIC DRIVE UNIT A AND SECOND PIEZOELECTRIC DRIVE UNIT B

WHEN VOLTAGE IS APPLIED TO SECOND PIEZOELECTRIC DRIVE UNIT B ALONE

CONTROL UNIT, OPTICAL DEFLECTION SYSTEM, IMAGE PROJECTION APPARATUS, AND CONTROL METHOD

CROSS-REFERENCE TO RELATED APPLICATION

This application claims priority pursuant to 35 U.S.C. § 119(a) to Japanese Patent Application Nos. 2016-053673, filed on Mar. 17, 2016, and 2017-025044, filed on Feb. 14, 2017 in the Japan Patent Office, the disclosure of which is incorporated by reference herein in its entirety.

BACKGROUND

Technical Field

This disclosure relates to a control unit, an optical deflection system, an image projection apparatus, and a control method.

Background Art

Moveable devices such as an optical deflection device having a reflector are used to deflect a light beam for optical scanning, in which a voltage is applied to a piezoelectric element to deform the piezoelectric element and to move the reflector by the deformed piezoelectric element. A control unit such as a drive unit controls a drive voltage having a given waveform to be applied to the piezoelectric element of the moveable device as disclosed, for example, JP-2015-55829-A. Typically, the control unit sets the drive voltage based on an assumption that the piezoelectric constant value is constant even if the drive voltage values change.

However, actually, the piezoelectric constant value varies depending on the drive voltage values. For example, the piezoelectric constant changes greatly near a minimum value of the drive voltage, in which deformation of the piezoelectric element does not become proportional to the change of drive voltage, and a constantness of a movement speed of the reflector is not achieved.

SUMMARY

As one aspect of present disclosure, a control unit to control a movement of a reflector is devised. The control unit includes a drive signal output unit to apply a drive voltage having a minimum value and a maximum value in one cycle to a piezoelectric element to deform the piezoelectric element, the deformation of the piezoelectric element causing the reflector to move, and circuitry to control the drive voltage to have the minimum value greater than a zero voltage by a given difference value.

As another aspect of present disclosure, a method of controlling a movement of a reflector is devised. The method includes applying a drive voltage having a given waveform with a minimum value and a maximum value to the piezoelectric element, controlling the drive voltage to have the minimum value greater than a zero voltage by a given difference value, and applying the drive voltage having the minimum value set greater than the zero voltage to the piezoelectric element to control the movement of the reflector through deforming the piezoelectric element.

BRIEF DESCRIPTION OF THE DRAWINGS

A more complete appreciation of the description and many of the attendant advantages and features thereof can be readily obtained and understood from the following detailed description with reference to the accompanying drawings, wherein.

Figure 1:
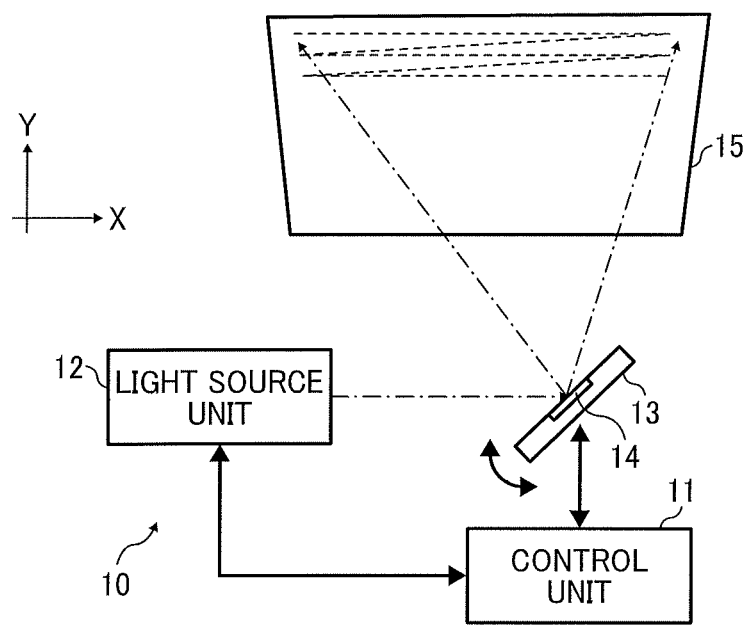
FIG. 1 illustrates a schematic example configuration of an optical scanning system of an embodiment of the present invention.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION

A description is now given of exemplary embodiments of present disclosure. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of present disclosure.

In addition, it should be noted that the terminology used herein is for the purpose of describing particular embodiments only and is not intended to be limiting of present disclosure. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Furthermore, although in describing views illustrated in the drawings, specific terminology is employed for the sake of clarity, the present disclosure is not limited to the specific terminology so selected and it is to be understood that each specific element includes all technical equivalents that operate in a similar manner and achieve a similar result. Referring now to the drawings, one or more apparatuses or systems according to one or more embodiments are described hereinafter.

(Optical Scanning System)

A description is given of an optical scanning system 10 employing a control unit of an embodiment of the present invention with reference to FIGS. 1 to 4. FIG. 1 illustrates a schematic example configuration of the optical scanning system 10. As described in FIG. 1, the optical scanning system 10 includes, for example, a control unit 11, a light source unit 12, and a moveable device 13 having a reflector 14. As to the optical scanning system, light emitted from the light source unit 12 under the control of the control unit 11 is deflected by the reflector 14 of the moveable device 13 to scan an image formation face 15. The image formation face 15 is scanned by the light deflected by the reflector 14 of the moveable device 13.

The control unit 11 is, for example, an electronic circuit that operates as a central processing unit (CPU) and/or field-programmable gate array (FPGA). The moveable device 13 includes, for example, the reflector 14. The moveable device 13 is, for example, a micro electro mechanical systems (MEMS) device that can move the reflector 14 together with its movement. The light source unit 12 is, for example, a laser unit that emits a laser beam. The image formation face 15 is, for example, a screen.

The control unit 11 generates a control command to control the light source unit 12 and the moveable device 13 based on the acquired optical scanning information, and outputs a drive signal to the light source unit 12 and the moveable device 13 based on the control command. The light source unit 12 emits light based on the drive signal input from the control unit 11. The moveable device 13 moves the reflector 14 into the one-axis direction or the two-axial directions based on the drive signal input from the control unit 11.

In this description, image information is one example of the optical scanning information. When the image information is input, under the control of the control unit 11, the moveable device 13 moves the reflector 14 with a given pattern within a given moveable range in the two-axial directions. When the light emitted from the light source unit 12 enters the reflector 14 moving with the given pattern within the given moveable range, the light is deflected by the reflector 14 about one axis to perform an optical scanning operation on the image formation face 15, with which an image can be projected on the image formation face 15. The moveable device 13 and the control unit 11 will be described later.

Figure 2:
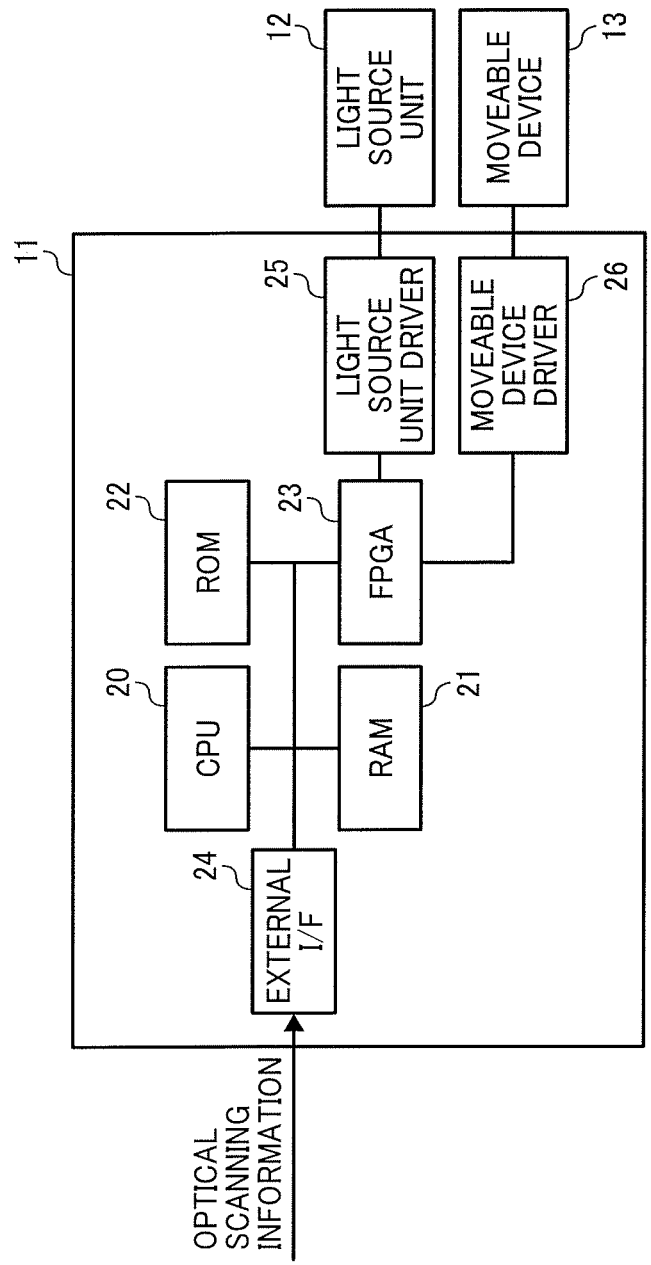
FIG. 2 is an example of a hardware block diagram (configuration) of the optical scanning system of FIG. 1.

A description is given of a hardware block diagram (configuration) of the optical scanning system 10 with reference to FIG. 2. FIG. 2 is an example of a hardware block diagram (configuration) of the optical scanning system 10. As described in FIG. 2, the optical scanning system 10 includes the control unit 11, the light source unit 12, and the moveable device 13, which are connected electrically.

(Control Unit)

The control unit 11 includes, for example, a CPU 20, a random access memory (RAM) 21, a read only memory (ROM) 22, a FPGA 23, an external interface (I/F) 24, a light source unit driver 25, and a moveable device driver 26.

The CPU 20 controls the control unit 11 entirely and devise capacities of the control unit 11. The CPU 20 reads programs and data from a memory such as the ROM22 and loads the programs and data on the RAM 21, and processes data.

The RAM21 is a volatile memory to store programs and data temporary.

The ROM22 is a non-volatile memory to store programs and data even when the power supply is turned off. The ROM22 stores programs and data used by the CPU 20 to control capacities of the optical scanning system 10.

The FPGA 23 is a circuit to output a control signal to the light source unit driver 25 and the moveable device driver 26 based on the processing by the CPU 20.

The external I/F 24 is an interface to communicate with, for example, an external apparatus and a network. The external apparatus includes, for example, at least one of apparatuses such as personal computer (PC), a storage device such as universal serial bus (USB) memory, secure digital (SD) card, compact disk (CD), digital versatile disk (DVD), hard disk drive (HDD), and solid state drive (SSD). The network includes, for example, a controller area network (CAN) of automobiles, a local area network (LAN), and the Internet. The external I/F 24 is used to connect with the external apparatus or to communicate with the external apparatus. In this example, the external I/F 24 is provided for each one of the external apparatuses.

The light source unit driver 25 is an electronic circuit that outputs a drive signal such as drive voltage to the light source unit 12 based on the input control signal.

The moveable device driver 26 is an electronic circuit that outputs a drive signal such as drive voltage to the moveable device 13 based on the input control signal.

In the control unit 11, the CPU 20 acquires optical scanning information from the external apparatus and/or the network via the external I/F 24. The CPU 20 acquires the optical scanning information by storing the optical scanning information in the ROM 22 and the FPGA 23 in the control unit 11, or the CPU 20 acquires the optical scanning information by storing the optical scanning information in another memory such as SSD added in the control unit 11.

In this description, the optical scanning information indicates information how to optically scan the image formation face 15 or information used for optically scanning the image formation face 15. For example, when images are displayed by performing the optical scanning operation, the optical scanning information corresponds to image information or data. For example, when an optical writing is performed by the optical scanning, the optical scanning information includes the sequence of writing data indicating writing positions. For example, when an object recognition is performed by the optical scanning, the optical scanning information includes timing of light emission for the object recognition and data indicating an emission area.

Figure 3:
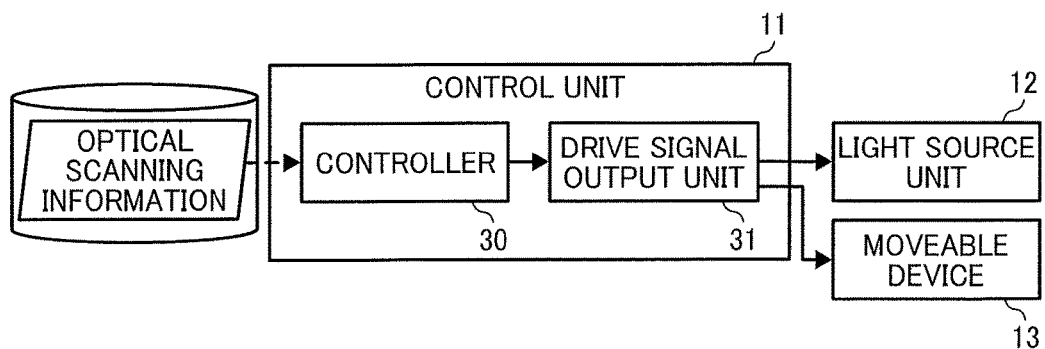
FIG. 3 is an example of a functional block diagram of a control unit of the optical scanning system of FIG. 1.

The control unit 11 implements functions as described in a functional block diagram in FIG. 3 based on a command from the CPU 20 and hardware of FIG. 2.

(Control Unit)

A description is given of a functional block diagram of the control unit 11 of the optical scanning system 10 with reference to FIG. 3. FIG. 3 is an example of a functional block diagram of the control unit of the optical scanning system 10.

As described in FIG. 3, the control unit 11 includes, for example, a controller 30, and a drive signal output unit 31.

The controller 30 is implemented by, for example, the CPU 20 and the FPGA 23. The controller 30 acquires the optical scanning information from an external apparatus, converts the optical scanning information to a control signal, and outputs the control signal to the drive signal output unit 31. For example, the controller 30 acquires image data as the optical scanning information from an external apparatus, generates a control signal from the image data by processing the image data, and outputs the control signal to the drive signal output unit 31. The drive signal output unit 31, used as a drive signal applicator, is implemented by the light source unit driver 25 and the moveable device driver 26. The drive signal output unit 31 outputs a drive signal to the light source unit 12 or the moveable device 13 based on the input control signal The drive signal is used to control the driving of the light source unit 12 or the moveable device 13. For example, the drive signal input to the light source unit 12 is a drive voltage to control the emission timing and emission intensity of the light source. For example, the drive signal input to the moveable device 13 is a drive voltage to control the timing when moving the reflector 14 starts and the moveable range of the reflector 14.

(Optical Scanning Process)

Figure 4:
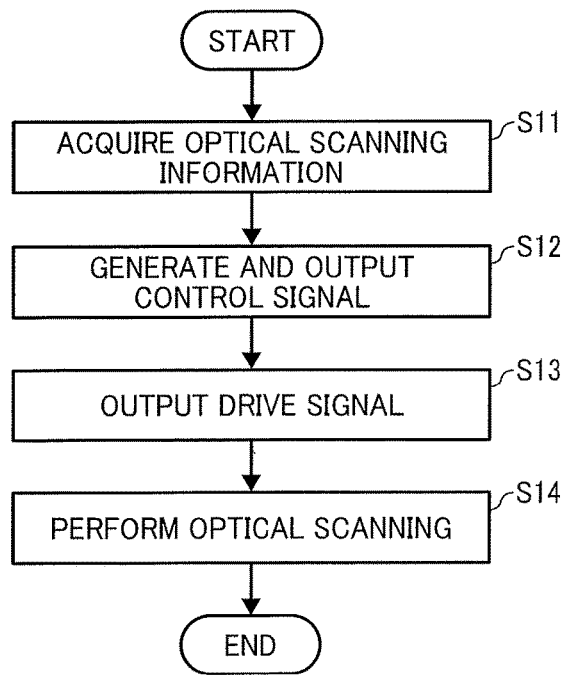
FIG. 4 is an example of a flow chart illustrating steps of a process of an optical scanning operation in the optical scanning system of FIG. 1.

A description is given of a process of optically scanning the image formation face 15 by using the optical scanning system 10 with reference to FIG. 4. FIG. 4 is an example of a flow chart illustrating steps of a process of an optical scanning operation in the optical scanning system 1.

At step S11, the controller 30 acquires the optical scanning information from an apparatus such as an external apparatus. At step S12, the controller 30 generates a control signal from the acquired optical scanning information, and outputs the control signal to the drive signal output unit 31. At step S13, the drive signal output unit 31 outputs a drive signal respectively to the light source unit 12 and the moveable device 13 based on the input control signal received from the controller 30. At step S4, the light source unit 12 emits light based on the drive signal received from the drive signal output unit 31, and further, the moveable device 13 moves the reflector 14 based on the drive signal received from the drive signal output unit 31. When the light source unit 12 and the moveable device 13 are driven, the light emitted from the light source unit 12 is deflected by the reflector 14 into one or more directions to perform the optical scanning operation on the image formation face 15.

As to the optical scanning system 10, the control unit 11 (one control unit) controls the light source unit 12 and the moveable device 13, but not limited thereto. For example, a control unit for the light source unit 12 and a control unit for the moveable device 13 may be different control units.

As to the optical scanning system 10, the control unit 11 (one control unit) includes the controller 30 and the drive signal output unit 31 for controlling the light source unit 12 and the moveable device 13, but not limited thereto. For example, the controller 30 and the drive signal output unit 31 can be disposed in different control units. For example, different from the control unit 11 having the controller 30, a drive signal output apparatus having the drive signal output unit 31 can be disposed. Further, as to the optical scanning system 10, the control unit 11 and the moveable device 13 having the reflector 14 can configure an optical deflection system or unit that deflects light.

(Image Projection Apparatus)

Figure 5:
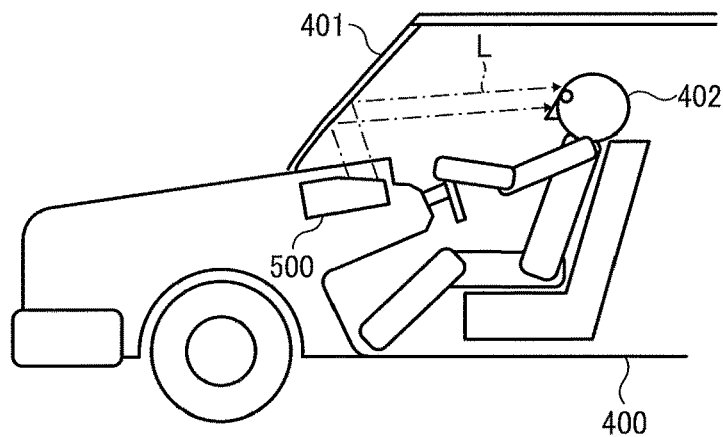
FIG. 5 is a schematic view of a vehicle mounted with an image projection apparatus such as a headup display.
Figure 6:
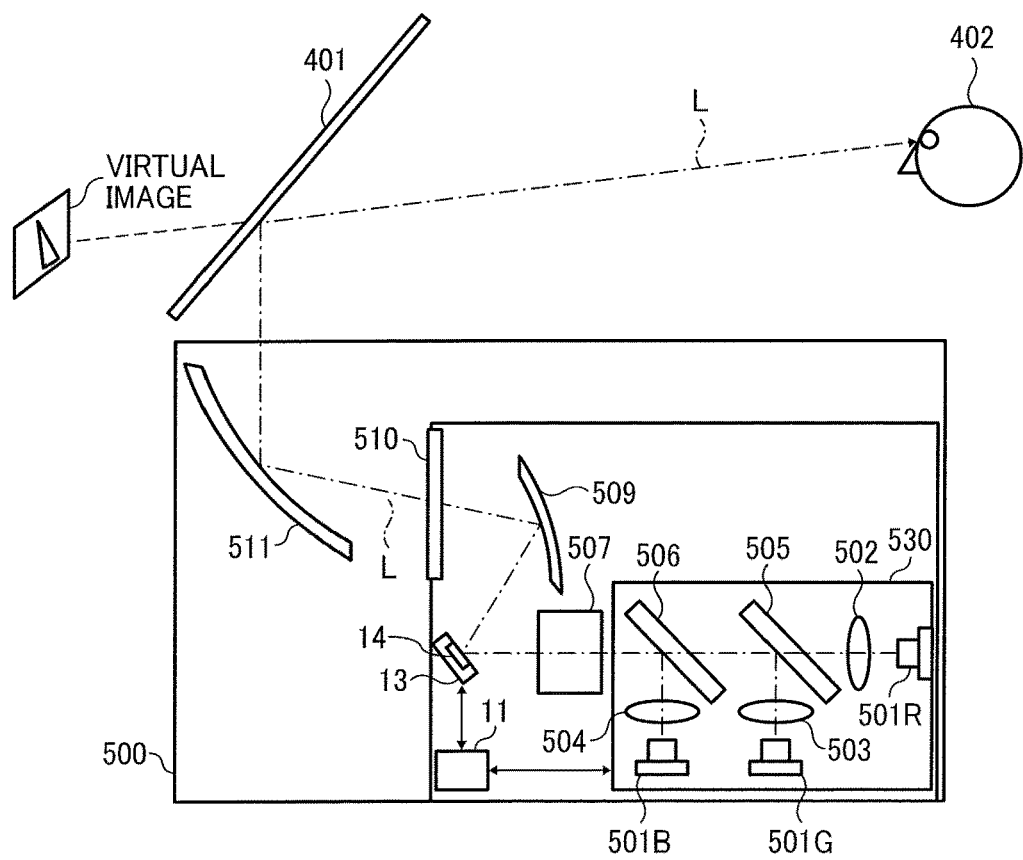
FIG. 6 is a schematic view of the headup display of FIG. 5.

A description is given of an image projection apparatus employing the control unit 11 with reference to FIGS. 5 and 6. FIG. 5 is a schematic view of a vehicle 400 mounted with an image projection apparatus such as a headup display 500. FIG. 6 is a schematic view of the headup display 500.

The image projection apparatus projects images by performing the optical scanning, and the image projection apparatus is, for example, a headup display apparatus.

As described in FIG. 5, the headup display 500 is disposed, for example, near a windshield 401 of a vehicle 400. Light flux L coming from the headup display 500 is reflected by the windshield 401, and directed to an observer such as a driver 402. With this configuration, the driver 402 can view an image projected by the headup display 500 as a virtual image. Further, when a combiner is disposed on an inner face of the windshield 401, the driver 402 can view an image projected by the headup display 500 as a virtual image generated by the light flux reflected by the combiner.

As described in FIG. 6, the head up display 500 includes, for example, a light emission unit having laser light sources 501R, 501G, 501B, collimator lenses 502, 503, 504, dichroic mirrors 505, 506, and a light adjuster 507, and a light projection unit having a free-curved mirror 509, an intermediate screen 510, and a projection mirror 511. The laser light sources 501R, 501G, 501B respectively emits a laser light of red, green, and blue. The collimator lenses 502, 503, 504 are respectively disposed for the laser light sources 501R, 501G, 501B. The light existing from the light adjuster 507 enters the moveable device 13 having the reflector 14, and the light deflected by the reflector 14 enters the light projection unit having the free-curved mirror 509, the intermediate screen 510, and the projection mirror 511, and then projected onto the windshield 401. The laser light sources 501R, 501G, 501B, the collimator lenses 502, 503, 504, and the dichroic mirrors 505 and 506 can be integrated into a housing to configure a light source unit 530.

When the headup display 500 projects an intermediate image displayed on the intermediate screen 510 to the windshield 401 of the vehicle 400, the driver 402 recognizes the intermediate image as the virtual image.

Each of the laser light emitted from the laser light sources 501R, 501G, 501B is adjusted to a substantially parallel light by the collimator lenses 502, 503, 504, and then the laser light emitted from the laser light sources 501R, 501G, 501B are synthesized by the dichroic mirrors 505 and 506. After the light adjuster 507 adjusts the intensity of the synthesized laser light, the moveable device 13 having the reflector 14 scans the synthesized laser light two dimensionally. The light flux L scanned two dimensionally by the moveable device 13 is reflected at the free-curved mirror 509 to correct the distortion, and is then focused on the intermediate screen 510 to display the synthesized laser light as the intermediate image on the intermediate screen 510. The intermediate screen 510 includes a micro lens array that arranges micro lenses two dimensionally, with which the intermediate screen 510 expands the light flux L by a unit of micro lens.

The moveable device 13 moves the reflector 14 into the two-axial directions with a given pattern, with which the light flux L that enters the reflector 14 can be scanned two dimensionally. The drive control of the moveable device 13 is synchronized with the light emission timing of the light sources 501R, 501G, 501B.

As above described, the head up display 500 is described as one example of the image projection apparatus, but is not limited thereto. The image projection apparatus can be any apparatuses that project images by performing the optical scanning operation by using the moveable device 13 having the reflector 14. For example, the image projection apparatus can be a projector set on a desk that projects an image on a screen, or a head-mount display that projects an image on a screen made of reflective and transmissive member, in which the display screen is mounted on a head of a user, or a head-mount display that projects an image on an eyeball as a screen.

Further, the image projection apparatus can be applied to any moveable vehicles such as automobiles, ships, airplanes, and mobile robots, or the image projection apparatus can be applied to any non-movables such as operation robots fixed at given positions to operate an operation unit such as manipulator unit.

(Optical Writing Apparatus)

Figure 7:
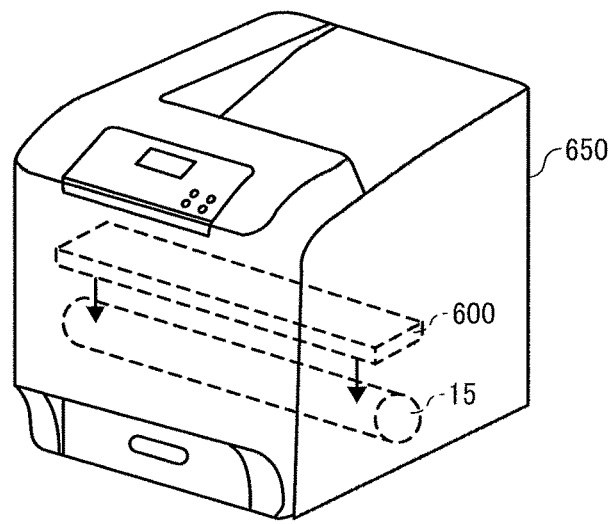
FIG. 7 is an example of a perspective view of an image forming apparatus having an optical writing apparatus.
Figure 8:
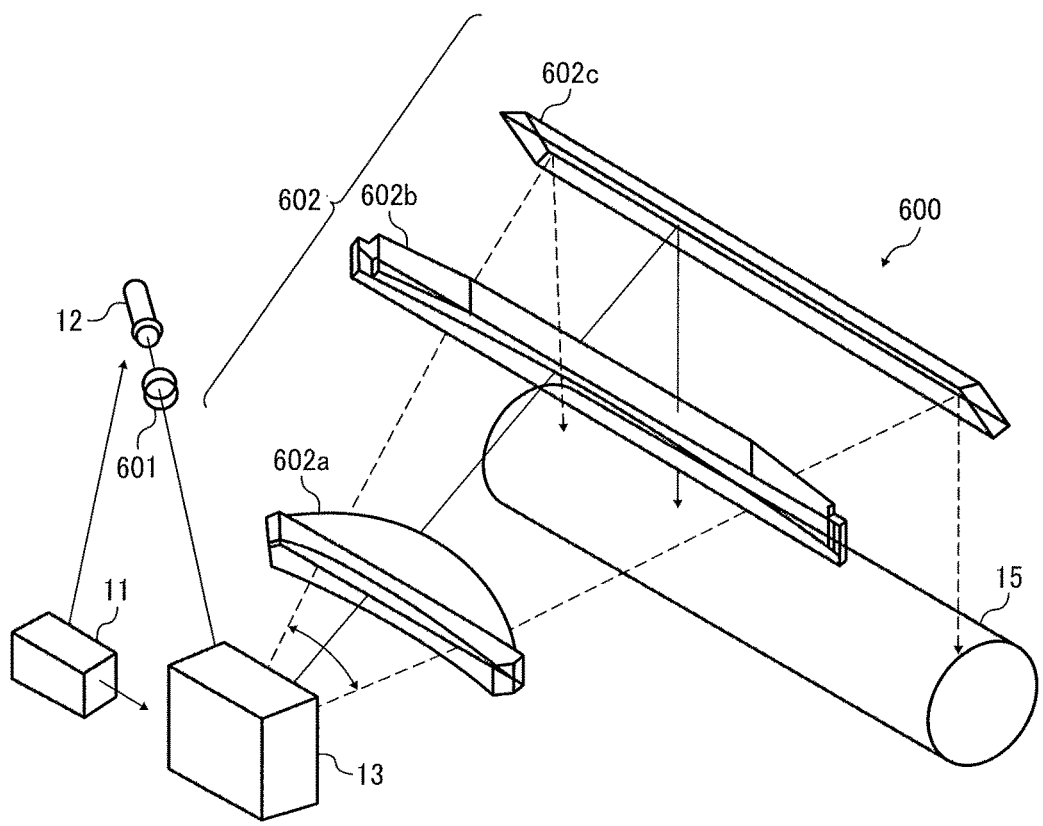
FIG. 8 is an example of a perspective view of an internal configuration of the optical writing apparatus of FIG. 7.

A description is given of an optical writing apparatus 600 employing the control unit 11 with reference to FIGS. 7 and 8.

FIG. 7 is an example of a perspective view of an image forming apparatus 650 having the optical writing apparatus 600. FIG. 8 is an example of a perspective view of an internal configuration of the optical writing apparatus 600.

As described in FIG. 7, the optical writing apparatus 600 is included in the image forming apparatus 650 such as a laser printer that uses a laser beam for a printing operation. In the image forming apparatus 650, the optical writing apparatus 600 optically scans a photoconductor drum used as the image formation face 15 by using one or more light beams to write an image on the photoconductor drum.

As described in FIG. 8, in the optical writing apparatus 600, light such as laser light emitted from the light source unit 12 such as a laser element passes through an image forming unit 601 such as a collimator lens, and then the light is deflected by the moveable device 13 having the reflector 14 into the one-axis direction or the two-axial direction. Then, the laser light deflected by the moveable device 13 passes through an optical scanning system 602 having a first lens 602a, a second lens 602b, and a reflection mirror 602c, and then the laser light is irradiated on the image formation face 15 such as a photoconductor drum and photosensitive paper to write an image optically. The optical scanning system 602 forms a light beam spot on t, the image formation face 15 such as the photoconductor drum. The light source unit 12 and the moveable device 13 having the reflector 14 can be driven under the control of the control unit 11.

The optical writing apparatus 600 can be used as a component of the image forming apparatus 650 such as a laser printer that uses a laser beam for a printing operation. Further, the optical writing apparatus 600 can be used as a component of the image forming apparatus 650 such as a laser labeling apparatus, in which a laser beam is scanned into the one-axis direction or the two-axial directions to optically scan a thermal medium to heat thermal medium, with which an image can be formed on thermal medium.

The moveable device 13 having the reflector 14 used for the optical writing apparatus 600 can be effective for power saving of the optical writing apparatus 600 compared to a multi-faced mirror such as a polygon mirror because consumption power for driving the moveable device 13 having the reflector 14 is smaller than consumption power for driving the polygon mirror. Further, the wind noise of the moveable device 13 when the moveable device 13 is oscillating can be reduced compared to the polygon mirror, and quietness of the optical writing apparatus 600 can be improved compared to the polygon mirror. Further, the installation space of the moveable device 13 can be reduced compared to the a polygon mirror, and heat generation of the moveable device 13 can be little compared to the polygon mirror, with which the optical writing apparatus 600 can be designed compact in size easily, and thereby the image forming apparatus 650 can be designed compact in size.

(Object Recognition Apparatus)

Figure 9:
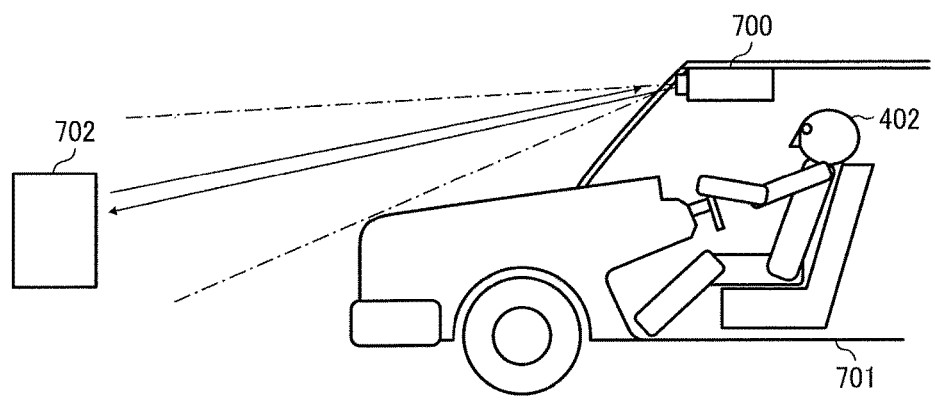
FIG. 9 is a schematic view of a vehicle mounted with a LIDAR, which is an example of the object recognition apparatus.
Figure 10:
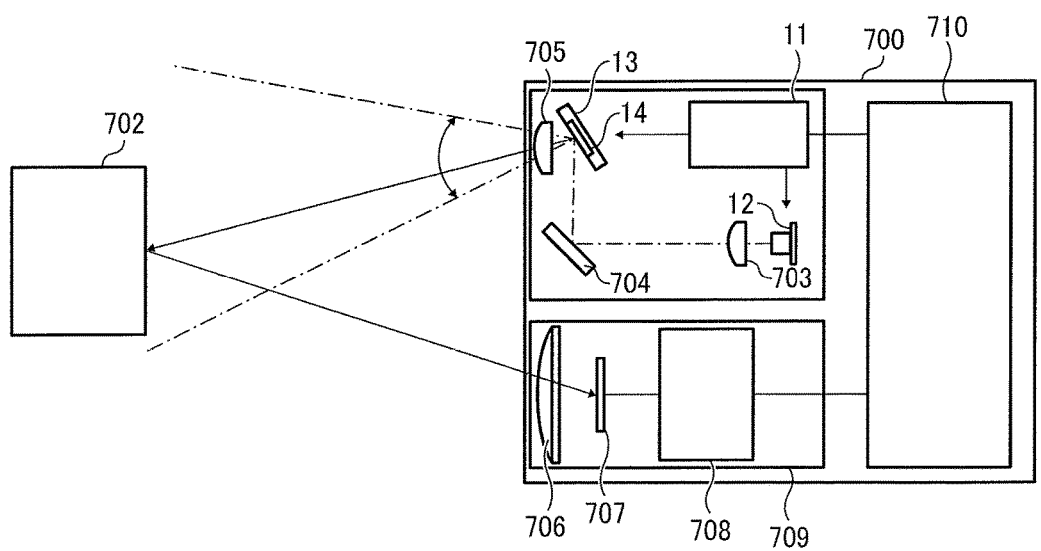
FIG. 10 is a schematic view of the LIDAR.

A description is given of an object recognition apparatus employing the control unit 11 with reference to FIGS. 9 and 10. The object recognition apparatus is used to recognize an object in a target direction, and the object recognition apparatus can be, for example, LIDAR (light detection and ranging, laser imaging detection and ranging), a laser radar or the like. FIG. 9 is a schematic view of a vehicle mounted with a LIDAR 700, which is an example of the object recognition apparatus. FIG. 10 is a schematic view of the LIDAR 700 of FIG. 9.

As described in FIG. 9, the LIDAR 700 is mounted in, for example, a vehicle 701. The LIDAR 700 performs the optical scanning operation for the target direction, in which the LIDAR 700 emits light to the target direction, and receives the light reflected from an object 702 to recognize the object 702.

As described in FIG. 10, the LIDAR 700 includes the control unit 11, the light source unit 12, the moveable device 13 having the reflector 14, a collimate lens 703, a flat mirror 704, a projection lens 705, a light detection unit 709, a focus lens 706, an image capture element 707, a signal processing unit 708, and a range calculation circuit 710.

The control unit 11 controls the driving of the light source unit 12 and the moveable device 13. The light emitted from the light source unit 12 passes through the light emission unit including the collimate lens 703 and the flat mirror 704 that changes the diverging light to the substantially parallel light, and then the substantially parallel light enters the moveable device 13 having the reflector 14. Then, the light is scanned into the one-axis direction or the two-axial directions by the reflector 14, and then emitted to the object 702 via the projection lens 705 used as the light projection unit. The light reflected from the object 702 is detected by the light detection unit 709. Specifically, the reflection light is received by the image capture element 707 via the focus lens 706 used as a light detection unit, and the image capture element 707 outputs a detection signal to the signal processing unit 708. The signal processing unit 708 performs various processing such as binarization and noise reduction to the input detection signal, and outputs the processed signal to the range calculation circuit 710.

The range calculation circuit 710 determines whether the object 702 exists, and calculates distance information of the object 702 based on a time difference between a time when the light source unit 12 emits the light and a time when the light detection unit 709 detects the reflection light, or a phase difference of pixels of the image capture element 707 that receives the reflection light.

Further, the moveable device 13 having the reflector 14 is hard to be damaged compared to a polygon mirror, and the moveable device 13 having the reflector 14 is smaller than the polygon mirror. Therefore, when the moveable device 13 having the reflector 14 is used for a radar apparatus, the radar apparatus having higher durability can be designed compact in size. The LIDAR 700 can be applied to any moveable vehicles such as automobiles, ships, airplanes, and mobile robots. The LIDAR 700 can determine whether the object 702 exists, and calculate the distance to the object 702 by performing the optical scanning operation for a given range.

In the above described object recognition apparatus, the LIDAR 700 is employed but not limited thereto. The object recognition apparatus can be applied to any apparatuses that performs the optical scanning operation by using the moveable device 13 having the reflector 14 under the control of the control unit 11, and receiving the reflection light by the light detection unit to recognize the object 702.

For example, the above described object recognition apparatus can be applied to a biometrics apparatus to optically scan hand and face to calculate object information such as shape from distance information as scan data, and to compare the scan data with pre-set data to recognize a target, a security sensor to recognize an intruder by optically scanning a target direction, and a three dimensional scanner to recognize a shape of object from distance information obtained by the optical scanning and outputs three dimensional data.

(Packaging)

Figure 11:
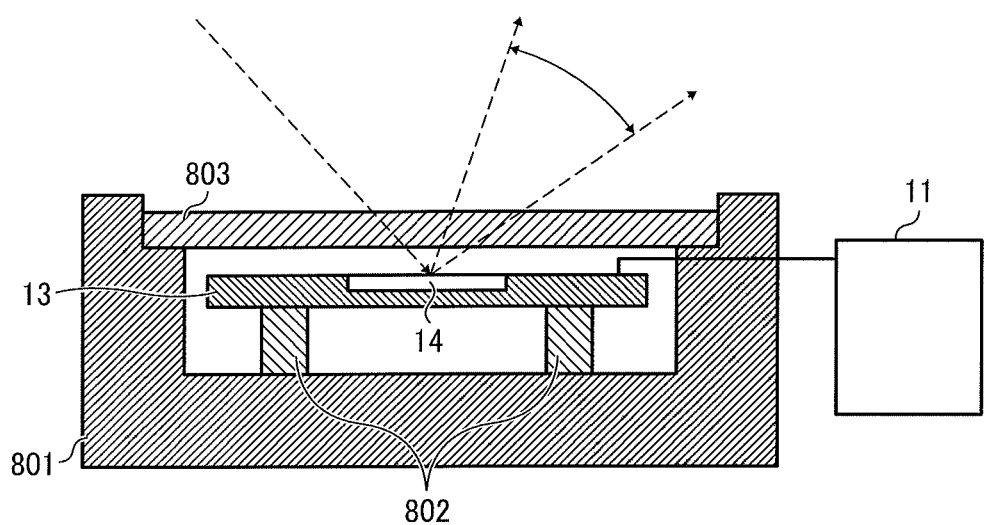
FIG. 11 is an example of a schematic view of packaging of the moveable device.

A description is given of packaging of the moveable device 13 controlled by the control unit 11 with reference to FIG. 11. FIG. 11 is a schematic view of packaging of the moveable device 13.

As described in FIG. 11, the moveable device 13 is set on a base member 802 disposed in a packaging member 801, and a translucent member 803 that covers a part of the packaging member 801 to seal the moveable device 13 in the packaging member 801. Further, inert gas such as nitrogen is filled in the packaging member 801. With this configuration, degradation or deterioration of the moveable device 13 by the oxidization can be suppressed, and durability of the moveable device 13 against environmental factors such temperature change can be improved.

A description is given of the moveable device 13 and the control unit 11 with reference to FIGS. 12 to 28. The moveable device 13 and the control unit 11 can be employed for the above described optical deflection system, the optical scanning system, the image projection apparatus, the optical writing apparatus, and the object recognition apparatus.

(Moveable Device)

Figure 12:
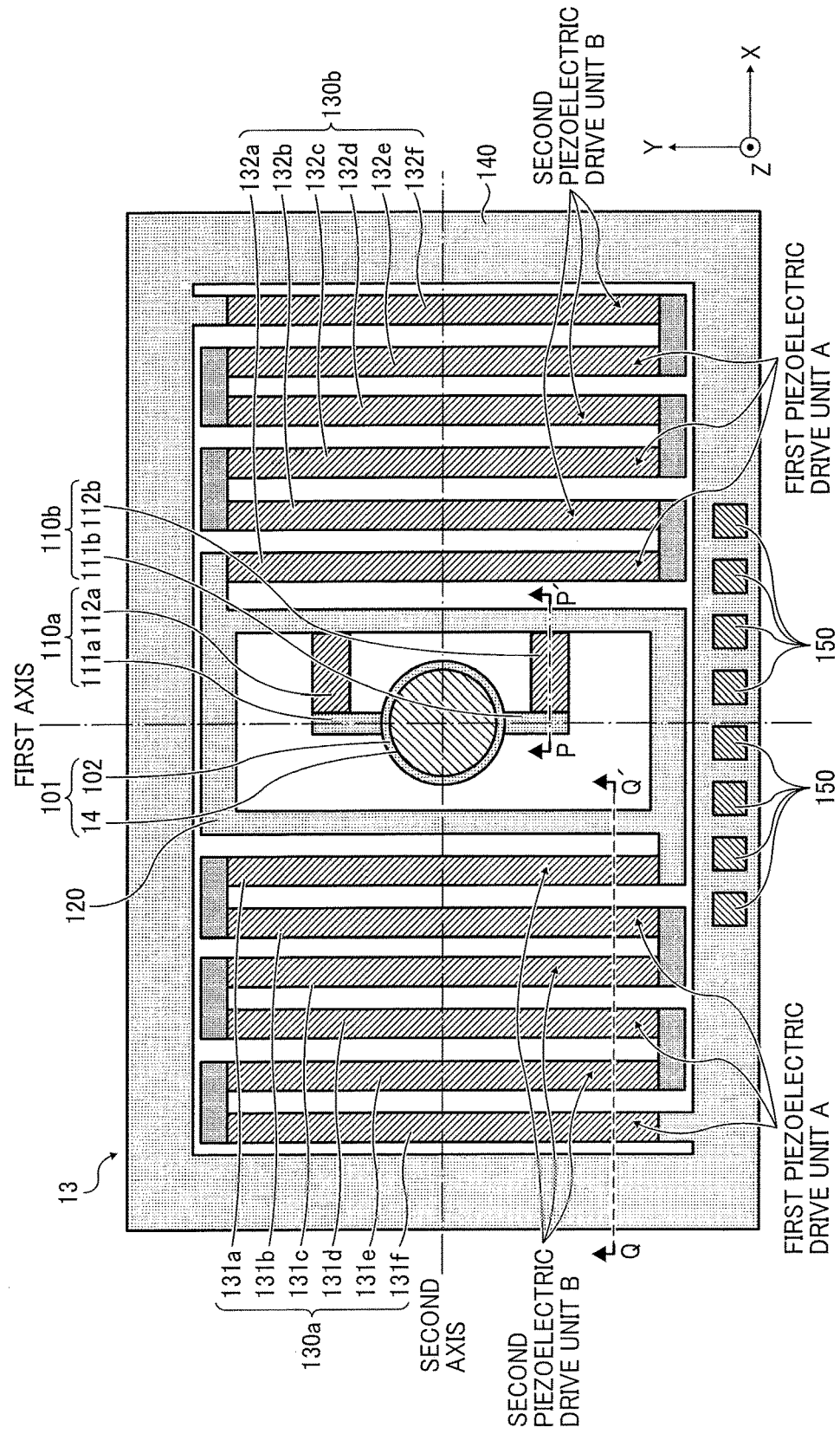
FIG. 12 is a plan view of the moveable device viewed from +Z direction.
Figure 13:
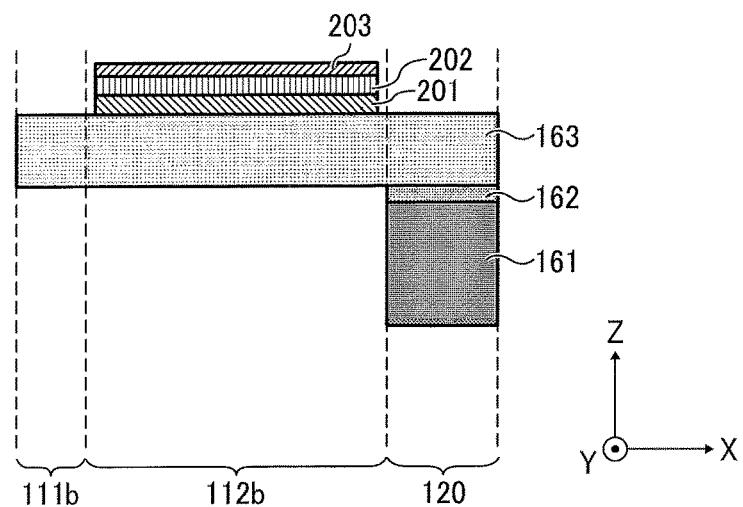
FIG. 13 is a cross-sectional view of the moveable device cut at the line P-P' in FIG. 12.
Figure 14:
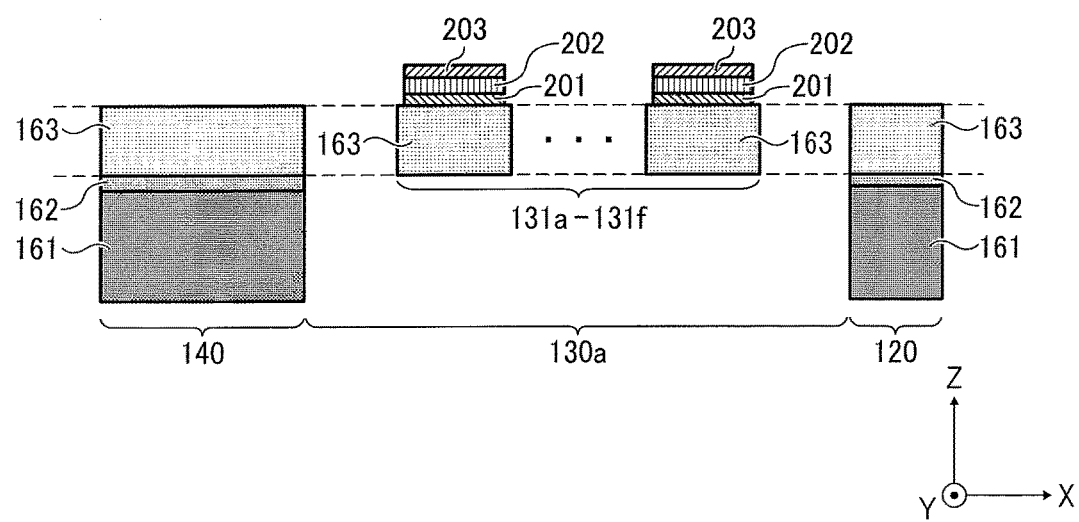
FIG. 14 is a cross-sectional view of the moveable device cut at the Q-Q' in FIG. 12.

A description is given of the moveable device 13 with reference to FIGS. 12 to 14. FIG. 12 is a plan view of the moveable device 13 that can deflect light into the two-axial directions. FIG. 13 is a cross-sectional view of the moveable device 13 cut at the line P-P' in FIG. 12. FIG. 14 is a cross-sectional view of the moveable device 13 cut at the Q-Q' in FIG. 12.

As described in FIG. 12, the moveable device 13 includes, for example, a mirror unit 101, first drive units 110a and 110b, a first supporter 120, second drive units 130a and 130b, a second supporter 140, and an electrode connectors 150. The mirror unit 101 reflects light that enters the mirror unit 101. The first drive units 110a and 110b are connected to the mirror unit 101, and drives the mirror unit 101 about a first axis parallel to the Y axis. The first supporter 120 supports the mirror unit 101 and the first drive units 110a and 110b. The second drive units 130a and 130b are connected to the first supporter 120, and drives the mirror unit 101 and the first supporter 120 about the second axis parallel to X axis. The second supporter 140 supports the second drive units 130a and 130b. The electrode connectors 150 are electrically connected to the first drive units 110a and 110b, the second drive units 130a and 130b, and the control unit 11.

The moveable device 13 can be made, for example, by performing an etching process to one silicon-on-insulator (SOI) substrate, in which the reflector 14, the first piezoelectric drivers 112a and 112b, the second piezoelectric drivers 131a to 131f and 132a to 132f, and the electrode connectors 150 can be formed on the same silicon-on-insulator (SOI) substrate as one integrated unit. Each of the members can be formed after forming the SOI substrate, or can be formed when forming the SOI substrate.

The SOI substrate includes a first silicon layer made of single crystalline silicon (Si) referred to as a silicon support layer 161, a silicon oxide layer 162, and a second silicon layer made of the single crystalline silicon (Si) referred to as a silicon active layer 163. The silicon oxide layer 162 is disposed on the silicon support layer 161, and the silicon active layer 163 is disposed on the silicon oxide layer 162.

Since the thickness of the silicon active layer 163 in the Z-axis direction is smaller than the thickness of the silicon active layer 163 in the X-axis direction or Y-axis direction, a portion made of the silicon active layer 163 alone can be used as an elastic member having elasticity.

The SOI substrate is not required to be a flat shape, but the SOI substrate can be a curved shape substrate having a curvature. Further, material used for forming the moveable device 13 is not limited to the SOI substrate, but other substrate that can be used, in which the other substrate can formed with various member integrally by the etching, and a part of the other substrate can be formed as an elastic member having elasticity.

The mirror unit 101 includes, for example, a mirror base 102 having a circle shape, and the reflector 14 formed on the mirror base 102 at the +Z-direction. The mirror base 102 includes, for example, the silicon active layer 163. The reflector 14 is configured with, for example, a thin metal layer such as aluminum, gold, or silver. Further, the mirror unit 101 can include a rib for reinforcing the mirror on the mirror base 102 at the −Z-direction. The rib includes, for example, the silicon support layer 161 and the silicon oxide layer 162. The rib can suppress distortion of the reflector 14 caused by the movement of the reflector 14.

The first drive units 110a and 110b respectively include, for example, the two torsion bars 111a and 111b, and the first piezoelectric drivers 112a and 112b. One end of each of the torsion bars 111a and 111b is connected to the mirror base 102, and each of the torsion bars 111a and 111b extends in the first axis direction to moveably support the mirror unit 101. Further, one end of each of the first piezoelectric drivers 112a and 112b is respectively connected to the torsion bars 111a and 111b, and another end of each of the first piezoelectric drivers 112a and 112b is connected to an inner side of the first supporter 120.

As described in FIG. 13, each of the torsion bars 111a and 111b includes, for example, the silicon active layer 163. Further, each of the first piezoelectric drivers 112a and 112b includes, for example, a lower electrode 201, a piezoelectric element 202, and an upper electrode 203 formed in this order. Specifically, the lower electrode 201 is formed on the silicon active layer 163 (i.e., elastic member) at the +Z-direction side of the silicon active layer 163, the piezoelectric element 202 is formed on the lower electrode 201, and the upper electrode 203 is formed on the piezoelectric element 202. Each of the upper electrode 203 and the lower electrode 201 is made of, for example, gold (Au) or platinum (Pt). The piezoelectric element 202 is made of, for example, piezoelectric material such as lead zirconate titanate (PZT).

As described in FIG. 12, the first supporter 120 includes, for example, the silicon support layer 161, the silicon oxide layer 162, and the silicon active layer 163. The first supporter 120 is a rectangular shaped member that supports the mirror unit 101 from the outer side of the mirror unit 101.

The second drive unit 130a includes, for example, a plurality of second piezoelectric drivers 131a to 131f connected with a meandering or zig-zag pattern, and the second drive unit 130b includes, for example, a plurality of second piezoelectric drivers 132a to 132f connected with a meandering or zig-zag pattern. One end of each of the second drive units 130a and 130b is connected to an outer side of the first supporter 120, and another end of each of the second drive units 130a and 130b is connected to an inner side of the second supporter 140. In this configuration, a connection point of the second drive unit 130a and the first supporter 120 and a connection point of the second drive unit 130b and the first supporter 120 are set with a point symmetry about the center of the reflector 14, and further, a connection point of the second drive unit 130a and the second supporter 140 and a connection point of the second drive unit 130b and the second supporter 140 set with a point symmetry about the center of the reflector 14.

As described in FIG. 14, each of the second drive units 130a and 130b includes, for example, a lower electrode 201, a piezoelectric element 202, a upper electrode 203 formed in this order. Specifically, the lower electrode 201 is formed on the silicon active layer 163 (i.e., elastic member) at the +Z-direction side of the silicon active layer 163, the piezoelectric element 202 is formed on the lower electrode 201, and the upper electrode 203 is formed on the piezoelectric element 202. Each of the upper electrode 203 and the lower electrode 201 is made of, for example, gold (Au) or platinum (Pt). The piezoelectric element 202 is made of, for example, piezoelectric material such as lead zirconate titanate (PZT).

As described in FIG. 12, the second supporter 140 includes, for example, the silicon support layer 161, the silicon oxide layer 162, and the silicon active layer 163. The second supporter 140 is a rectangular shaped member that supports the mirror unit 101, the first drive units 110a and 110b, the first supporter 120, and the second drive units 130a and 130b from the outer side of the mirror unit 101, the first drive units 110a and 110b, the first supporter 120, and the second drive units 130a and 130b.

The electrode connectors 150 are formed, for example, on the second supporter 140 at +Z-direction side, and electrically connected with the upper electrode 203 and the lower electrode 201 of each of the first piezoelectric drivers 112a and 112b, and the second piezoelectric drivers 131a to 131f, and the control unit 11 via wiring such as aluminum (Al). Further, the upper electrode 203 or the lower electrode 201 can be connected to the electrode connectors 150 directly by connecting the electrodes or in directly.

In this description, the piezoelectric element 202 is formed at one side of the silicon active layer 163 (e.g., +Z-direction side) used as the elastic member, but the piezoelectric element 202 can be formed at another side of the silicon active layer 163 (e.g., −Z-direction side) used as the elastic member, or the piezoelectric element 202 can be formed both sides of the silicon active layer 163 used as the elastic member.

Further, the shape of each of the member is not limited to the above described configuration as long as the mirror unit 101 can be driven about the first axis or about the second axis. For example, the torsion bars 111a and 111b, and the first piezoelectric drivers 112a and 112b can be a curved shape having a curvature.

Further, an insulation layer made of silicon oxide film can be formed on at least any one of a +Z-direction side face of the upper electrode 203 of the first drive units 110a and 110b, a +Z-direction side face of the first supporter 120, a +Z-direction side face of the upper electrode 203 of the second drive units 130a and 130b, and a +Z-direction side face of the second supporter 140. In this configuration, the wiring can be disposed on the insulation layer, further, an opening is formed at the connection spot where the upper electrode 203 or the lower electrode 201 and the wiring are connected by removing the insulation layer partially or not forming the insulation layer, with which the freedom of design of the first drive units 110a and 110b, the second drive units 130a and 130b, and the wiring can be enhanced, and further, the short caused by a contact of the electrodes can be suppressed or prevented. Further, the silicon oxide film can be used as anti-reflection (AR) coating.

(Control Unit)

A description is given of the control unit 11 that drives the first drive units 110a and 110b and the second drive units 130a and 130b of the moveable device 13.

When a positive voltage or a negative voltage is applied to the polarization direction of the piezoelectric element 202 formed in the first drive units 110a and 110b, and the second drive units 130a and 130b, deformation proportional to the applied voltage level (e.g., expansion and shrinking) occurs, which is known as the inverse piezoelectric effect. The first drive units 110a and 110b, and the second drive units 130a and 130b move the mirror unit 101 by using the inverse piezoelectric effect.

When light flux enters the reflector 14 of the mirror unit 101, the light flux is deflected by the reflector 14 by setting a deflection angle. The deflection angle of light flux is also referred to as an oscillation angle. When a voltage is not applied to the piezoelectric element 202, the oscillation angle is set zero. When the deflection angle is greater than zero, the oscillation angle is set with a positive value, and when the deflection angle is smaller than zero, the oscillation angle is set with a negative value.

A description is given of the control unit 11 that drives the first drive units 110a and 110b. As to the first drive units 110a and 110b, when a drive voltage is applied parallelly to each of the piezoelectric element 202 formed in the first piezoelectric drivers 112a and 112b via the upper electrode 203 and the lower electrode 201, each of the piezoelectric elements 202 deforms. Then, each of the first piezoelectric drivers 112a and 112b deforms due to the deformation of the piezoelectric element 202. Then, the two torsion bars 111a and 111b are twisted due to the deformation of the first piezoelectric drivers 112a and 112b, and the mirror unit 101 is driven about the first axis due to the twisting of the two torsion bars 111a and 111b, and then the mirror unit 101 moves about the first axis. The drive voltage applied to the first drive units 110a and 110b is controlled by the control unit 11.

Therefore, when the control unit 11 applies the drive voltage having a given sinusoidal waveform parallelly to the first piezoelectric drivers 112a and 112b of the first drive units 110a and 110b, the mirror unit 101 can move about the first axis with a cycle of the drive voltage having the given sinusoidal waveform.

Especially, for example, when the frequency of sinusoidal waveform voltage is set same as the resonance frequency of each of the torsion bars 111a and 111b such as about 20 kHz, the mirror unit 101 can be resonanced and driven with about 20 kHz by using a mechanical resonance frequency caused by the twisting of the each of the torsion bars 111a and 111b.

A description is given of the control unit 11 that drives the second drive units 130a and 130b with reference to FIGS. 15 to 27.

Figure 15A:
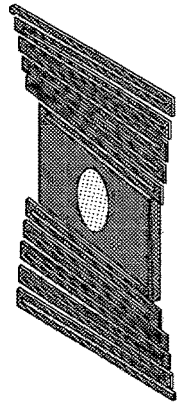
FIGS. 15A to 15C are schematic views of deformation of second drive units of the moveable device.
Figure 15B:
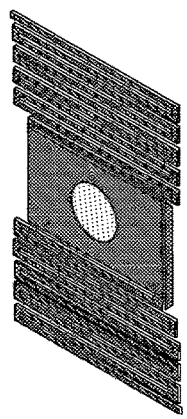
Figure 15C:
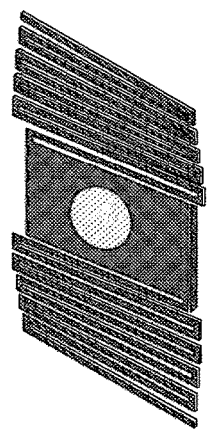

FIGS. 15A to 15C re schematic views of deformation of the second drive unit 130b of the moveable device 13, in which a slashed line area indicates the mirror unit 101.

Among the plurality of the second piezoelectric drivers 131a to 131f of the second drive unit 130a, the second piezoelectric drivers at the even-number positions counted from the second piezoelectric driver 131a that is at the closest distance from the mirror unit 101, which means the second piezoelectric drivers 131b, 131d, 131f are referred to a first piezoelectric drive unit A. Further, among the plurality of the second piezoelectric drivers 132a to 132f of the second drive unit 130b, the second piezoelectric drivers at the odd-number positions counted from the second piezoelectric driver 132a that is at the closest distance from the mirror unit 101, which means he second piezoelectric drivers 132a, 132c, 132e are also referred to the first piezoelectric drive unit A. When a drive voltage is parallelly applied to the first piezoelectric drive units A, as described in FIG. 15A, the first piezoelectric drive units A deform in the same direction, and the mirror unit 101 moves about the second axis with a positive oscillation angle.

Further, among the plurality of the second piezoelectric drivers 131a to 131f of the second drive unit 130a, the second piezoelectric drivers at the odd-number positions counted from the second piezoelectric driver 131a that is at the closest distance from the mirror unit 101, which means the second piezoelectric drivers 131a, 131c, 131e are referred to a second piezoelectric drive unit B. Further, among the plurality of the second piezoelectric drivers 132a to 132f of the second drive unit 130b, the second piezoelectric drivers at the even-number positions counted from the second piezoelectric driver 132a that is at the closest distance from the mirror unit 101, which means the second piezoelectric drivers 132b, 132d, 132f are also referred to the second piezoelectric drive unit B. When a drive voltage is parallelly applied to the second piezoelectric drive units B, as described in FIG. 15C, the second piezoelectric drive units B deform in the same direction, and the mirror unit 101 moves about the second axis with a negative oscillation angle.

As described in FIGS. 15A and 15C, as to the second drive unit 130a or the second drive unit 130b, the plurality of piezoelectric elements 202 of the first piezoelectric drive unit A or the plurality of piezoelectric elements 202 of the second piezoelectric drive unit B are deformed to accumulate the deformation level, with which the oscillation angle of the mirror unit 101 about the second axis can be increased.

For example, as described in FIG. 12, the second drive units 130a and 130b are connected to the first supporter 120 by setting the point symmetry about the center of the first supporter 120. Therefore, when the drive voltage is applied to the first piezoelectric drive units A, a drive force that moves the second drive unit 130a in the +Z direction occurs at the connection point of the first supporter 120 and the second drive unit 130a, and a drive force that moves the second drive unit 130b in the −Z direction occurs at the connection point of the first supporter 120 and the second drive unit 130b, and by accumulating the deformation movement, the oscillation angle of the mirror unit 101 about the second axis can be increased.

Further, as described in FIG. 15B, when no voltage is applied or when a first movement level of the mirror unit 101 caused by the first piezoelectric drive unit A applied with a voltage and a second movement level of the mirror unit 101 caused by the second piezoelectric drive unit B applied with a voltage become even, the oscillation angle becomes zero.

The mirror unit 101 can be driven about the second axis by applying the drive voltage to the second drive units 130a and 130b to repeat the sequence of FIGS. 15A to 15C.

(Drive Voltage)

The drive voltage applied to the second drive units 130a and 130b is controlled by the control unit 11. A description is given of a drive voltage applied to the first piezoelectric drive unit A (hereinafter, first drive voltage A), and a drive voltage applied to the second piezoelectric drive unit B (hereinafter, second drive voltage B) with reference to FIG. 16.

Figure 16A:
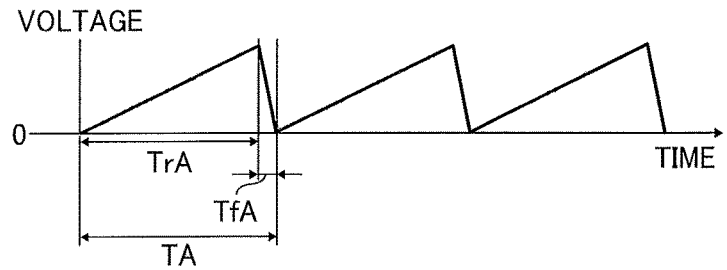
FIG. 16A is an example of a waveform of the first drive voltage Applied to the first piezoelectric drive unit of the moveable device.
Figure 16B:
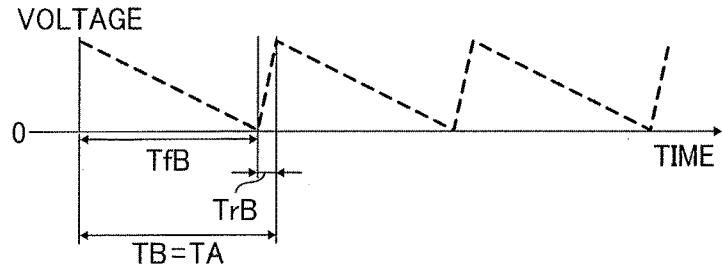
FIG. 16B is an example of a waveform of the second drive voltage applied to the second piezoelectric drive unit of the moveable device.
Figure 16C:
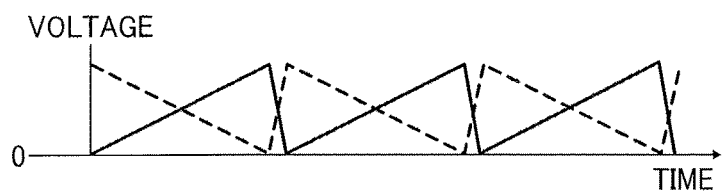
FIG. 16C illustrates a case that the waveform of the first drive voltage And the waveform of the second drive voltage are superimposed.

FIG. 16A is an example of a waveform of the first drive voltage A applied to the first piezoelectric drive unit A of the moveable device 13. FIG. 16B is an example of a waveform of the second drive voltage B applied to the second piezoelectric drive unit B of the moveable device 13. FIG. 16C illustrates a case that the waveform of the first drive voltage A and the waveform of the second drive voltage B are superimposed.

As described in FIG. 16A, the first drive voltage A applied to the first piezoelectric drive unit A is, for example, a drive voltage having a sawtooth waveform and a frequency of, for example, 60 Hz. Further, the first drive voltage A has a rising time period TrA and a falling time period TfA in one cycle TA, in which a voltage value increases from a local minimum to a next local maximum during the rising time period TrA, and a voltage valuate decreases from a local maximum to a next local minimum during the falling time period TfA. For example, a ratio of TrA:TfA=9:1 is set. A ratio of TrA in the one cycle is referred to as symmetry of the first drive voltage A.

As described in FIG. 16B, the second drive voltage B applied to the second piezoelectric drive unit B is, for example, a drive voltage having a sawtooth waveform and a frequency of, for example, 60 Hz. Further, the second drive voltage B has a rising time period TrB and a falling time period TfB in one cycle TB, in which a voltage value increases from a local minimum to a next local maximum during the rising time period TrB, a voltage valuate decreases from a local maximum to a next local minimum during the falling time period TfB. For example, a ratio of TfB:TrB=9:1 is set. A ratio of TfB in the one cycle is referred to as symmetry of the second drive voltage B. Further, as described in FIG. 16C, for example, the one cycle TA of the first drive voltage A and the one cycle TB of the second drive voltage B can be are set with the same value.

Each of the sawtooth waveform of the first drive voltage A and the sawtooth waveform of the second drive voltage B can be generated by superimposing sinusoidal waves. Further, in this description, the first drive voltage A and the second drive voltage B employ the sawtooth waveform drive voltage, but not limited thereto. For example, the waveform can be changed depending on a device property of the moveable device 13 such as a sawtooth-waveform drive voltage having a rounded top, and a sawtooth-waveform drive voltage having a curved portion instead of a straight line.

Figure 17:
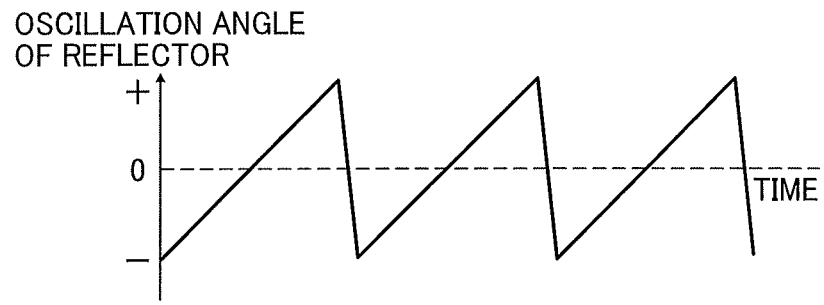
FIG. 17 illustrates one example of a timewise change of an oscillation angle of a reflector about a second axis when a movement speed of the reflector about the second axis is constant.
Figure 18:
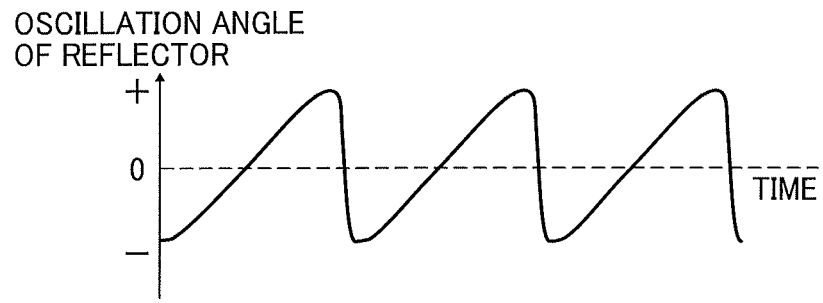
FIG. 18 illustrates another example of the timewise change of the oscillation angle of the reflector about the second axis when the movement speed of the reflector about the second axis is not constant.

A description is given of the movement speed of the reflector 14 of the moveable device 13 about the second axis that is a timewise change of the oscillation angle of the reflector 14 about the second axis with reference to FIGS. 17 to 19.

Figure 19A:
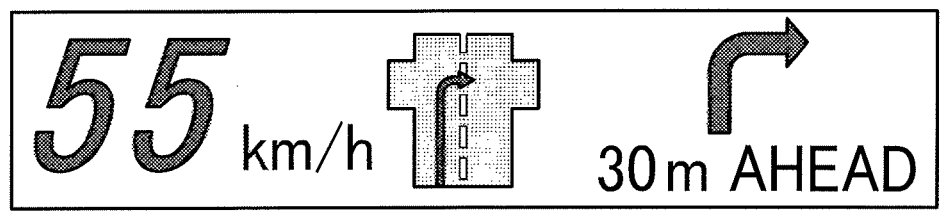
FIG. 19A illustrates one example of a projection image when the movement speed of the reflector about the second axis is constant.
Figure 19B:
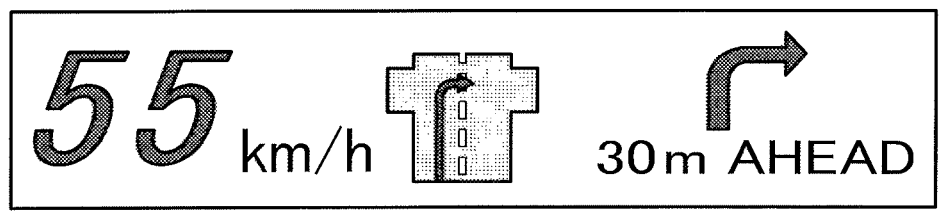
FIG. 19B illustrates another example a projection image when the movement speed of the reflector about the second axis is not constant.

FIG. 17 illustrates one example case of the timewise change of the oscillation angle of the reflector 14 about the second axis when the movement speed of the reflector 14 about the second axis is constant. FIG. 18 illustrates another example case of the timewise change of the oscillation angle of the reflector 14 about the second axis when the movement speed of the reflector 14 about the second axis is not constant. FIG. 19A illustrates one example of a projection image when the movement speed of the reflector 14 of the mirror unit 101 about the second axis is constant. FIG. 19B illustrates another example a projection image when the movement speed of the reflector 14 of the mirror unit 101 about the second axis is not constant.

The timewise change of the oscillation angle of the reflector 14 about the second axis, which is the movement speed of the reflector 14 about the second axis, is preferably a straight line as described in FIG. 17, which means that it is preferable that fluctuation does not occur to the movement speed of the mirror unit 101 about the second axis. If the fluctuation occurs to the movement speed of the mirror unit 101 about the second axis, the optical scanning operation cannot be performed linearly, with which luminance fluctuation and distortion occur to images formed on the image formation face 15, and thereby the image quality degrades.

However, as to the actual device, when the mirror unit 101 is moved about the second axis by the second drive units 130a and 130b, the fluctuation occurs to the movement speed near the minus-side maximum value and the plus-side maximum value of the oscillation angle as described in FIG. 18. In this case, the movement speed is decreased and the movement speed becomes dull, with which the constantness of the movement speed cannot be maintained.
(Projection Image)
When the moveable device 13 having the not constant movement speed (see FIG. 18) optically scans the image formation face 15 to project a projection image, the projection image is distorted at the upper part and the lower part of the image as described in FIG. 19B although the projection image is to be displayed with a correct size as described in FIG. 19A.

Therefore, in this description, when the control unit 11 applies a drive voltage having a given waveform to the piezoelectric element 202, the control unit 11 controls a minimum value of the drive voltage having the given waveform. Specifically, the control unit 11 sets the minimum value of the drive voltage having the given waveform at a given level greater than zero voltage.

When the mirror unit 101 is moved about the second axis by using the drive voltage having the given waveform by setting the minimum value of the drive voltage with the given level greater than zero voltage, the fluctuation of the movement speed near the minus-side maximum value and the plus-side maximum value of the oscillation angle can be suppressed, with which the constantness of the movement speed of the mirror unit 101 can be enhanced.

Figure 20:
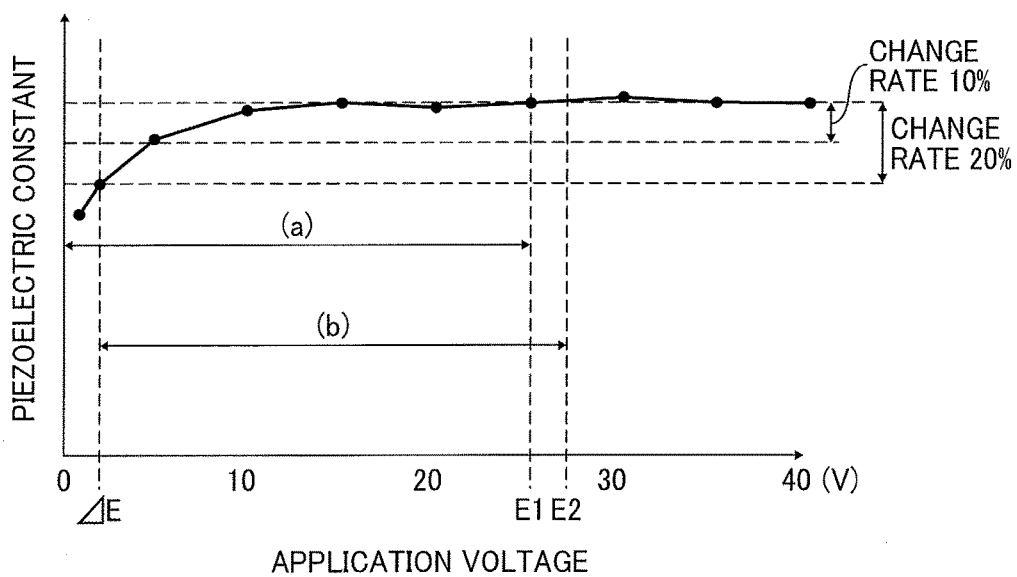
FIG. 20 is a piezoelectric constant profile of a piezoelectric element indicating a relationship of the piezoelectric constant of the piezoelectric element and voltage applied to the piezoelectric element.

A description is given of a reason why that the constantness of the movement speed of the mirror unit 101 can be enhanced by the above described controlling with reference to FIGS. 20 to 23.
(Piezoelectric Constant)
FIG. 20 is a piezoelectric constant profile of the piezoelectric element 202, which indicates a relationship of the piezoelectric constant of the piezoelectric element 202 and the voltage applied to the piezoelectric element 202, which indicates the voltage dependency of the piezoelectric constant. The piezoelectric constant of the piezoelectric element 202 can be calculated as below.

The piezoelectric element 202 made of PZT is formed on +Z side face of the elastic member made of the silicon active layer having a length L, and a voltage is applied to the upper and lower side of the piezoelectric element 202 to deform the elastic member. Then, by changing the voltage, a deformation level ΔK of an end of the elastic member is measured using the laser Doppler vibrometer (LDV). Then, a piezoelectric constant d31 with respect to the applied voltage can be calculated based on the deformation level ΔK measured at the end of the elastic member, and the equation (1). The piezoelectric constant d31 is used as an indicator indicating how the piezoelectric element 202 is deformed when the voltage E is applied.

$$\Delta K = \frac{3L^2}{2T_{PZT}} \cdot \frac{2AB(1+B)}{A^2B^4 + 2A(2B + 3B^2 + 2B^3) + 1} \cdot d_{31} \cdot E \quad (1)$$

In the equation (1), ΔK indicates the deformation level at the end of the elastic member, L denotes the length of the elastic member, $T_{PZT}$ denotes the thickness of PZT, d31 denotes the piezoelectric constant, E denotes an electric field applied to the PZT, A denotes a constant obtained as $E_{Si}$(Young's modulus of Si)/$E_{PZT}$(Young's modulus of PZT), and B denotes a ratio of $T_{Si}$(thickness of Si used as elastic member)/$T_{PZT}$(thickness of PZT). In this example case, the parameters are set as L=3500 μm, $T_{PZT}$=2 μm, $E_{Si}$=170 GPa, $E_{PZT}$=90 GPa, $T_{Si}$=40 μm to calculate the piezoelectric constant d31.

As described in FIG. 20, when the application voltage is from 0V to 10V, the piezoelectric constant of the piezoelectric element 202 is not constant, and when the application voltage becomes 10V or more, the piezoelectric constant of the piezoelectric element 202 becomes substantially constant. Especially, the piezoelectric constant changes greatly when the application voltage is from 0V to 5V. This phenomenon may be caused by PZT of the piezoelectric element 202 formed by a sputtering method or a sol-gel method using a spin coat. Typically, the piezoelectric constant of the PZT formed by these methods may not become a constant value until the application voltage becomes a given value, which means the deformation level of the piezoelectric element 202 varies depending on the application voltage level.

Therefore, when a first range (a) indicated in FIG. 20 is set as a voltage range of the drive voltage for one cycle, and the drive voltage is applied to the piezoelectric element 202, the drive voltage repeats the rising and falling between 0 to E1 voltage. In this case, the deformation of the piezoelectric element 202 is not proportional to the voltage value at the lower voltage range that is near 0 voltage where the piezoelectric constant changes greatly. Therefore, the constantness of the movement speed of the mirror unit 101 near the maximum oscillation angle cannot be maintained when the piezoelectric element 202 is applied with the drive voltage at the lower voltage range that is near zero (0) voltage.

In view of this issue, in the embodiment, the control unit 11 controls the voltage value of the drive voltage applied to the piezoelectric element 202 using a second range (b) indicated in FIG. 20, in which the voltage value of the drive voltage is set from the minimum voltage value ΔE greater than 0V to the maximum voltage value E2. Therefore, the control unit 11 applies the drive voltage that repeats the rising and falling between the voltages ΔE to E2.

The minimum voltage value ΔE can be determined in view of a change rate of the piezoelectric constant value, wherein the change rate of the piezoelectric constant value is defined by a change ratio of one piezoelectric constant value when the maximum voltage value is applied and another piezoelectric constant value when the minimum voltage value is applied in one cycle.

Specifically, the minimum voltage value ΔE is set with a value such that the change rate of the piezoelectric constant value becomes within 20%. Further, the minimum voltage value ΔE is preferably set with a value such that the change rate of the piezoelectric constant value becomes within 10%.

Further, the change rate of the piezoelectric constant value can be defined by a change ratio of one piezoelectric constant value when the maximum voltage value is applied in a half cycle of the drive voltage starting from an application of the drive voltage and another piezoelectric constant value when the minimum voltage value is applied in the half cycle of the drive voltage starting from the application of the drive voltage.

Depending on the property of the piezoelectric element 202, the piezoelectric constant of the piezoelectric constant profile becomes a local maximum when the drive voltage of several voltages is applied, and then the piezoelectric constant of the piezoelectric constant profile decreases gradually. In this case too, by setting the minimum voltage value ΔE based on the change rate of the piezoelectric constant value in the half cycle of the drive voltage starting from the application of the drive voltage, the constantness of the movement speed of the reflector 14 about the second axis can be enhanced by the a proportional relationship of the deformation level and the voltage value in the lower voltage range, and the piezoelectric polarization effects to be described later.

With this configuration, the drive voltage is set with a voltage range that the change rate of the piezoelectric constant value becomes smaller, with which the deformation of the piezoelectric element 202 becomes substantially proportional to the voltage level of the drive voltage, with which the constantness of the movement speed of the reflector 14 about the second axis can be enhanced.

(Drive Voltage)

Figure 21:
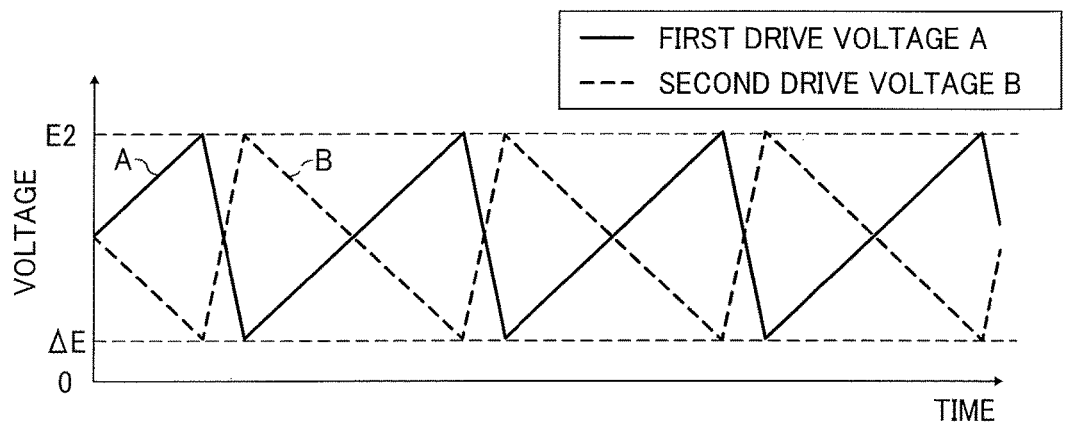
FIG. 21 illustrates an example of waveforms of the first drive voltage and the second drive voltage setting a voltage range from a minimum voltage value ΔE to a maximum voltage value E2.

FIG. 21 illustrates an example of waveforms of the first drive voltage A and the second drive voltage B respectively applied to the piezoelectric element 202 of the first piezoelectric drive unit A and the second piezoelectric drive unit B by setting the voltage range of ΔE to E2 to the first drive voltage A and the second drive voltage B.

In this configuration, a change of the movement speed of the reflector 14 about the second axis, that is the timewise change of the oscillation angle, can be evaluated as a constantness indicator by changing the minimum voltage value ΔE (FIG. 21) applied to the second drive units 130a and 130b.

Figure 22:
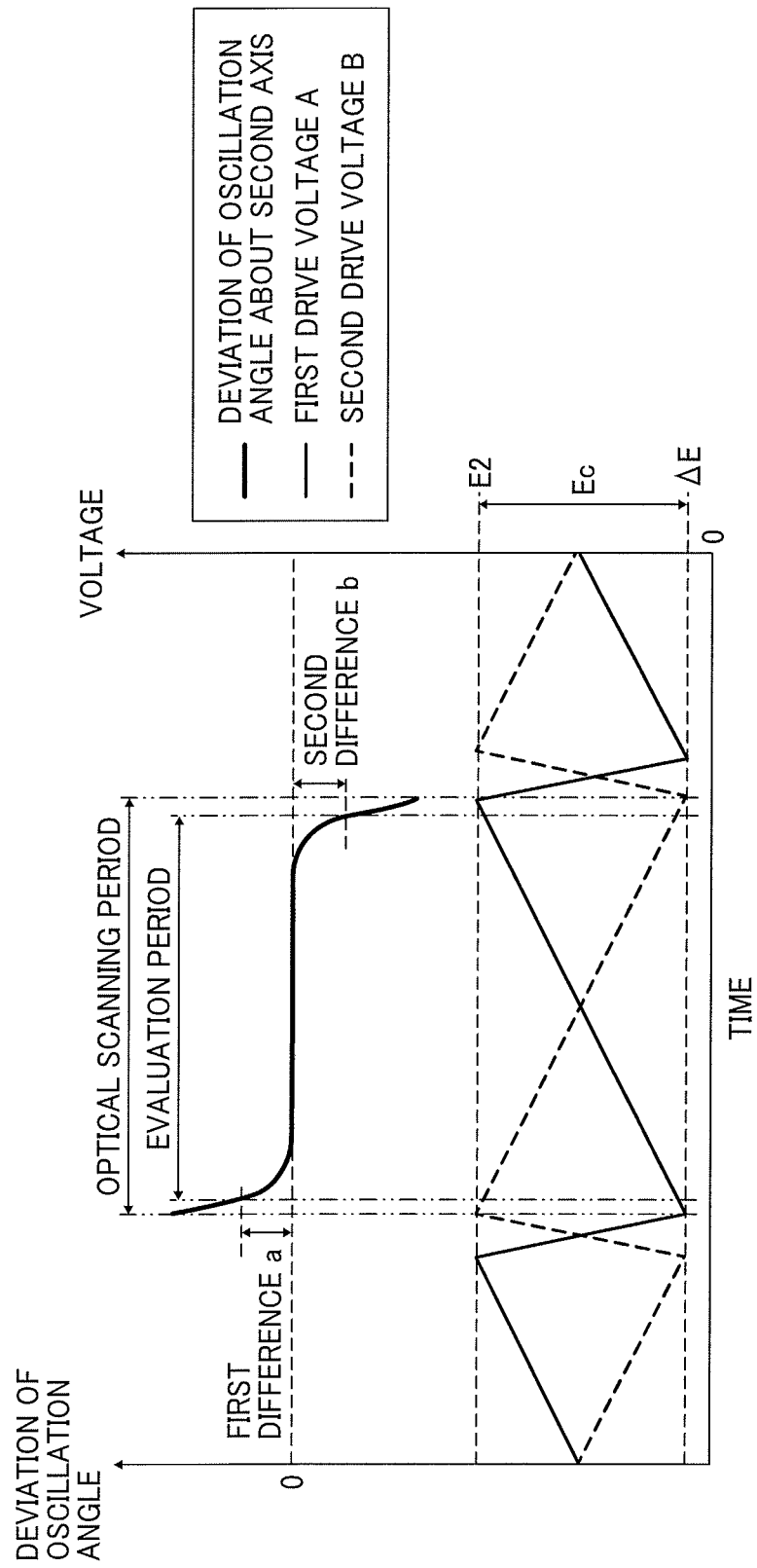
FIG. 22 illustrates a profile of deviation of an oscillation angle, and a profile of an application voltage.

A description is given of the constantness indicator with reference to FIG. 22. FIG. 22 illustrates a profile of deviation of the oscillation angle, and a profile of application voltage, in which the first vertical axis (i.e., vertical axis at left in FIG. 22) indicates the deviation of the oscillation angle, the second vertical axis (i.e., vertical axis at right in FIG. 22) indicates the application voltage, and the horizontal axis indicates the time. As described in FIG. 22, an optical scanning period is used to perform the optical scanning operation. The optical scanning period corresponds to, for example, the rising time TrA of the first drive voltage A or the falling time TfB of the second drive voltage B described in FIG. 16.

Further, an evaluation period is set for 90% of the optical scanning period. Specifically, the evaluation period can be set by subtracting one time period of 5% from the start of the one cycle of the optical scanning period and another time period of 5% from the end of the one cycle of the optical scanning period from the entire optical scanning period. Further, when the image forming operation is performed, the evaluation period is typically used as an image forming period.

Further, a bold solid line of FIG. 22 indicates a deviation of the oscillation angle, which indicates the deviation from the ideal oscillation angle. Specifically, an approximation straight line is calculated by performing the least-squares approximation to the timewise change of the oscillation angle about the second axis for the evaluation period, and then the approximation straight line is subtracted from the timewise change of the oscillation angle to acquire the deviation of the oscillation angle. In this case, the maximum deviation of the oscillation angle in the positive direction is set as a first difference "a," and the maximum deviation of the oscillation angle in the negative direction is set as a second difference "b."

The constantness indicator indicating the linearity level of the scanning line can be defined as below.

Constantness indicator=(first difference "a"+second difference "b")/(maximum voltage value E2−minimum voltage value ΔE)

The smaller the constantness indicator, the more constant the movement speed. The maximum voltage value E2 and the minimum voltage value ΔE can be changed while setting a difference Ec of the maximum voltage value E2 and the minimum voltage value ΔE as a fixed value.

Figure 23:
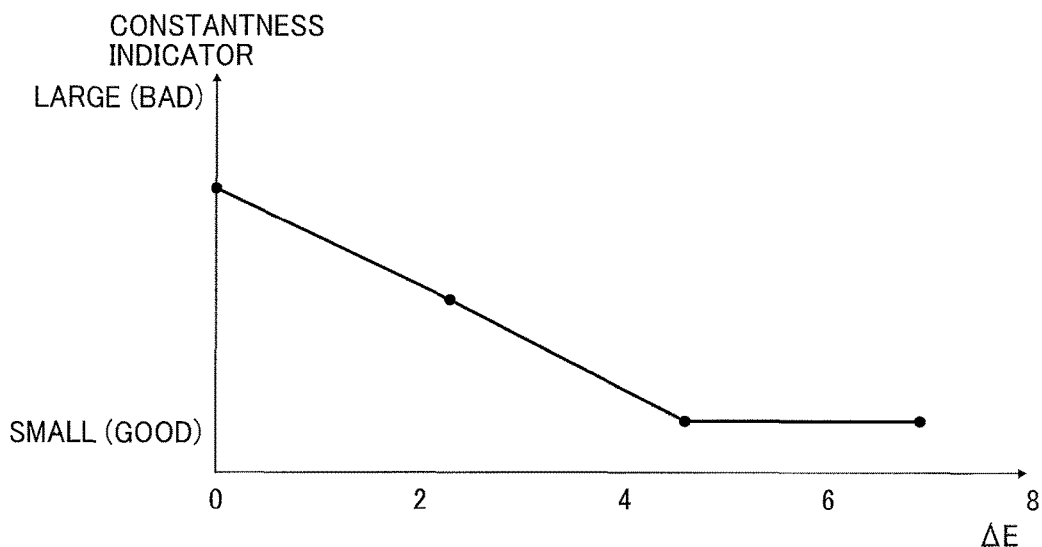
FIG. 23 is an example of a profile of a constantness indicator by changing the minimum voltage value ΔE.

FIG. 23 is an example of a profile of the constantness indicator by changing the minimum voltage value ΔE, in which the horizontal axis indicates the minimum voltage value ΔE, and the horizontal axis indicates the constantness indicator. As indicated in FIG. 23, the greater the minimum voltage value ΔE, the smaller the constantness indicator, and thereby the constantness of the movement speed is enhanced. Further, when the minimum voltage value ΔE is set with a give value or more, the constantness indicator does not change so much. For example, when the minimum voltage value ΔE is set about 2V, the change rate of the piezoelectric constant value becomes about 20%, with which the constantness indicator is enhanced. For example, when the minimum voltage value ΔE is set about 4.5V, the change rate of the piezoelectric constant value becomes about 10%, with which the constantness indicator is further enhanced. For example, when the minimum voltage value ΔE is set about 7V, the change rate of the piezoelectric constant value becomes about 5%, and the constantness indicator when the minimum voltage value ΔE is set about 7V becomes substantially same as the constantness indicator when the minimum voltage value ΔE is set about 4.5V.

If the minimum voltage value ΔE is set too great, the change rate of the piezoelectric constant value does not become so great, and thereby the constantness indicator does not change so much whereas the consumption power increases and the piezoelectric element 202 may be damaged by the increased consumption power, which is not preferable.

Therefore, the minimum voltage value ΔE is set with a value such that the change rate of the piezoelectric constant value is set from 5% to 20% both inclusive, with which the increase of the consumption power and damage of the piezoelectric element 202 can be suppressed while the constantness indicator can be enhanced. Further, preferably, the minimum voltage value ΔE is set with a value such that the change rate of the piezoelectric constant value is set from 5% to 10% both inclusive, with which the constantness indicator can be further enhanced.

Further, the piezoelectric constant of the piezoelectric element 202 becomes different depending of a method of forming the piezoelectric element 202, and material components ratio of the piezoelectric element 202. Therefore, the constantness indicator indicating the linearity level of the scanning line is measured by increasing the minimum voltage value ΔE gradually or by decreasing the minimum voltage value ΔE gradually.

For example, when the constantness indicator becomes a preferable value when one voltage is applied, the one voltage can be set as a suitable minimum voltage value ΔE. For example, when the constantness indicator becomes within 5% by applying the drive voltage having one voltage, the one voltage can be set as a suitable minimum voltage value ΔE.

As to the above described embodiment, the control unit 11 sets the minimum value of the drive voltage having the given waveform applied to the second drive units 130a and 130b greater than zero voltage, which means the control unit 11 controls the drive voltage to have the minimum value greater than zero voltage as a given difference value. The given difference is set with a value such that the change rate of the piezoelectric constant value of the piezoelectric element 202 when the minimum value of the drive voltage is set greater than zero voltage becomes smaller than the change rate of the piezoelectric constant value of the piezoelectric element 202 when the minimum value of the drive voltage is set zero voltage in one cycle, with which the constantness of the movement speed of the reflector 14 can be enhanced. More specifically, the control unit 11 sets the minimum value of the drive voltage greater than the lower voltage range near 0V where the piezoelectric constant value of the piezoelectric element 202 changes greatly as described in FIG. 23. In other words, the control unit 11 uses the second range (b) of the drive voltage indicated in FIG. 20 instead of the first range (a) of the drive voltage indicated in FIG. 20. With this configuration, the dullness indicated in FIG. 18 can be suppressed as described in FIG. 17, which means the constantness of the movement speed of the reflector 14 can be enhanced. When the constantness of the movement speed of the reflector 14 is enhanced, for example, the distortion of the projection image at the upper part and the lower part of the image (see FIG. 19B) can be suppressed, with which the projection image can be displayed correctly (see FIG. 19A).

Figure 24:
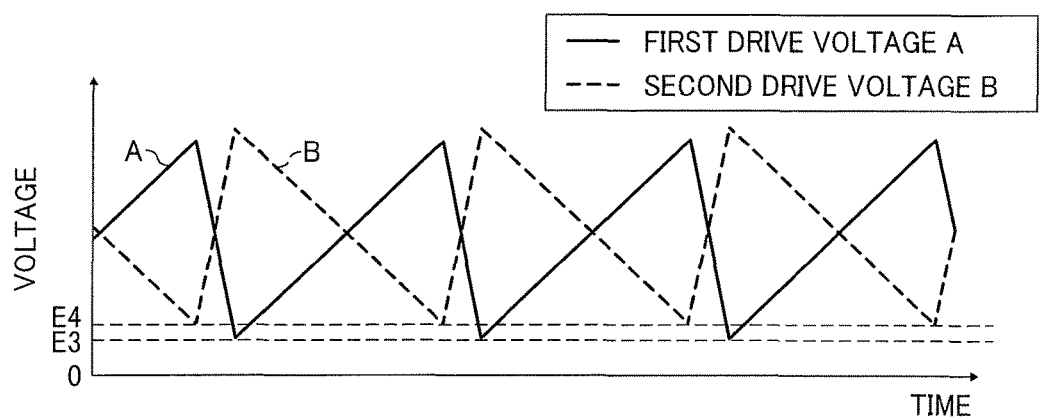
FIG. 24 illustrates an example of waveforms of the first drive voltage and the second drive voltage setting the minimum voltage value ΔE set differently.
Figure 25:
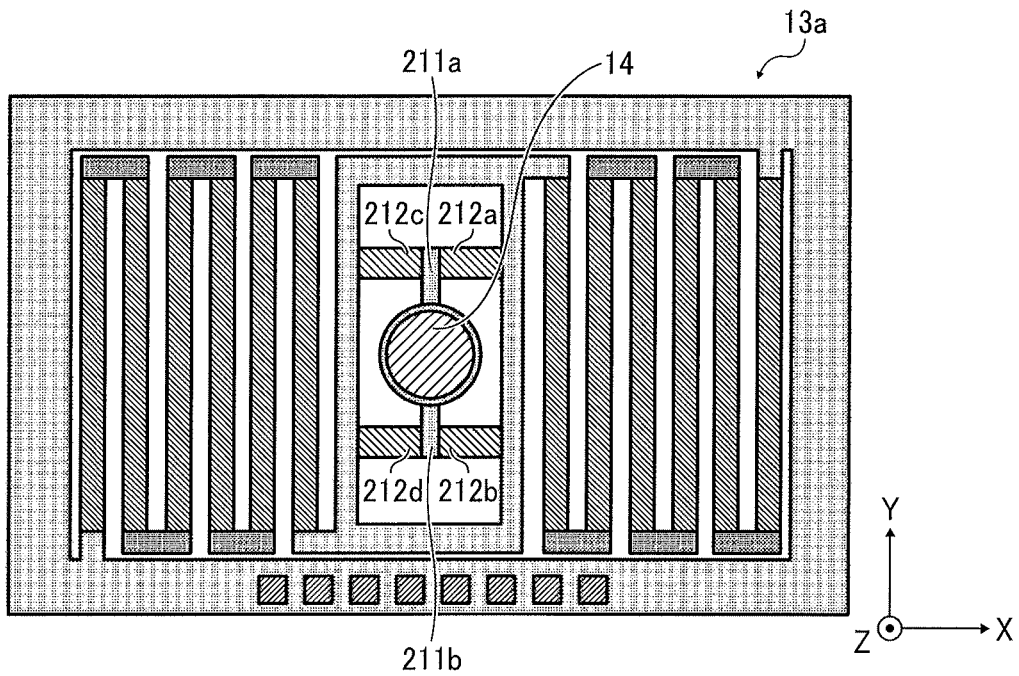
FIG. 25 is a plan view of a first variant example of the moveable device viewed from +Z direction.
Figure 26:
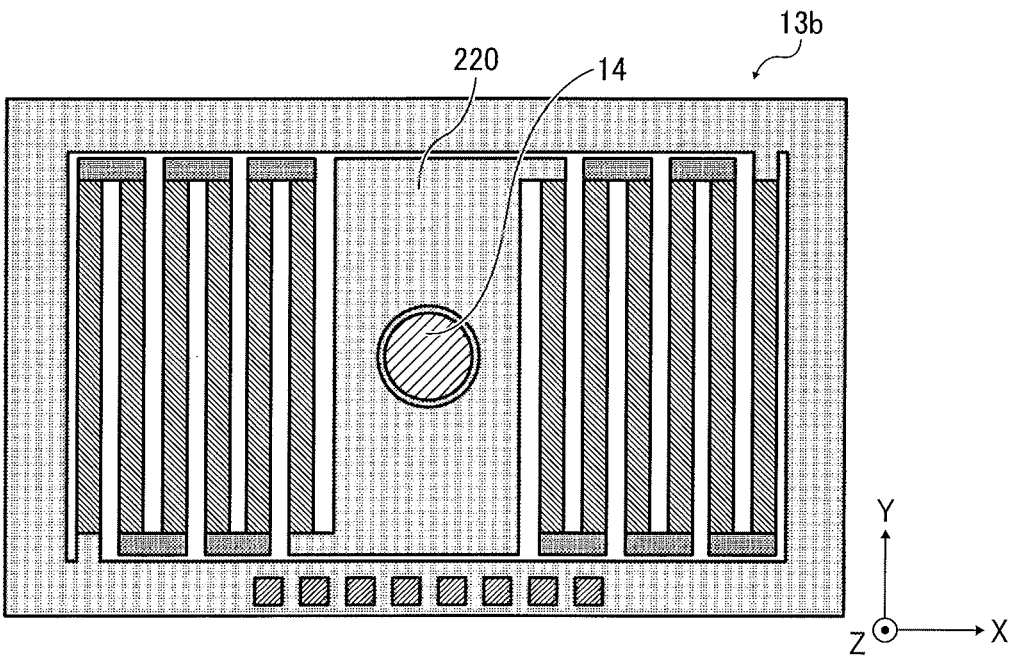
FIG. 26 is a plan view of a second variant example of the moveable device viewed from +Z direction.

Further, a modification of the embodiment of the control unit 11 can be devised as described in FIG. 24. As described in FIG. 24, the minimum value of the drive voltage can be set differently for the first drive voltage A applied to the first piezoelectric drive unit A, and the second drive voltage B applied to the second piezoelectric drive unit B. For example, when the minimum value of the first drive voltage A is set with a voltage E3, and the minimum value of the second drive voltage B can be set as a voltage E4 while setting the relationship of "E4>E3," with which the constantness of the movement speed of the reflector 14 can be further enhanced. For example, E4 is preferably adjusted within ±5% of E3.

The minimum value of the drive voltage is set differently for the first drive voltage A applied to the first piezoelectric drive unit A, and the second drive voltage B applied to the second piezoelectric drive unit B because the design of wiring and connection spots of the first piezoelectric drive unit A and the second piezoelectric drive unit B are not the same completely, and further, the manufacturing error occurs to the first piezoelectric drive unit A and the second piezoelectric drive unit B, and thereby the piezoelectric constant and deformation level with respect to the applied drive voltage may not become the same between the first piezoelectric drive unit A and the second piezoelectric drive unit B. Therefore, the constantness of the movement speed of the reflector 14 can be further enhanced by setting the minimum value of the drive voltage differently for the first drive voltage A applied to the first piezoelectric drive unit A, and the second drive voltage B applied to the second piezoelectric drive unit B.

Further, another modification of the control unit 11 can be devised by setting the symmetry of the first drive voltage A and the symmetry of the second drive voltage B differently. When the moveable device 13 is driven by a modulation signal (e.g., sawtooth wave signal), the modulation signal is processed by the Fourier transform to decompose into frequency components known as the frequency spectrum. Depending on the types of the modulation signal, the frequency spectrum has one or more valleys where the power density becomes theoretically zero with a given interval. By adjusting the symmetry of the first drive voltage A or the second drive voltage B, the frequency band of the valley can be adjusted, and by adjusting the symmetry of the first drive voltage A or the second drive voltage B such that a mechanical resonance frequency of the moveable device 13 is set in the frequency band of the valleys, a mechanical resonance of the moveable device 13 caused by a higher harmonic wave component of the drive voltage can be suppressed, with which the constantness of the movement speed of the reflector 14 can be enhanced.

In the above described embodiment, the control unit 11 constantly applies the drive voltage having the positive value to the piezoelectric element 202, but not limited thereto as long as the piezoelectric element 202 can be deformed when the drive voltage is applied to the piezoelectric element 202. For example, the control unit 11 can constantly apply a drive voltage having a negative value to the piezoelectric element 202. When the drive voltage having the given waveform is constantly the negative value, the minimum value becomes a value where the potential from the ground becomes the minimum.

In the above description, as described in FIG. 12, each of the first piezoelectric drivers 112a and 112b of the moveable device 13 extends into the +X direction from each of the torsion bars 111a and 111b, which is known as a cantilever, but not limited thereto as long as the reflector 14 can be moved by the piezoelectric element 202 applied by the voltage. For example, a double-supported moveable device 13a can be used as described in FIG. 25, in which each of the first piezoelectric drivers 212a and 212b extends into the +X direction from each of torsion bars 211a and 211b, and each of the first piezoelectric drivers 212c and 212d extends into the −X direction from each of torsion bars 211a and 211b. Further, as described in FIG. 26, a moveable device 13b can include a moveable member 220 disposed with the reflector 14 when the reflector 14 is designed to be moved about the one axis direction alone.

Figure 27:
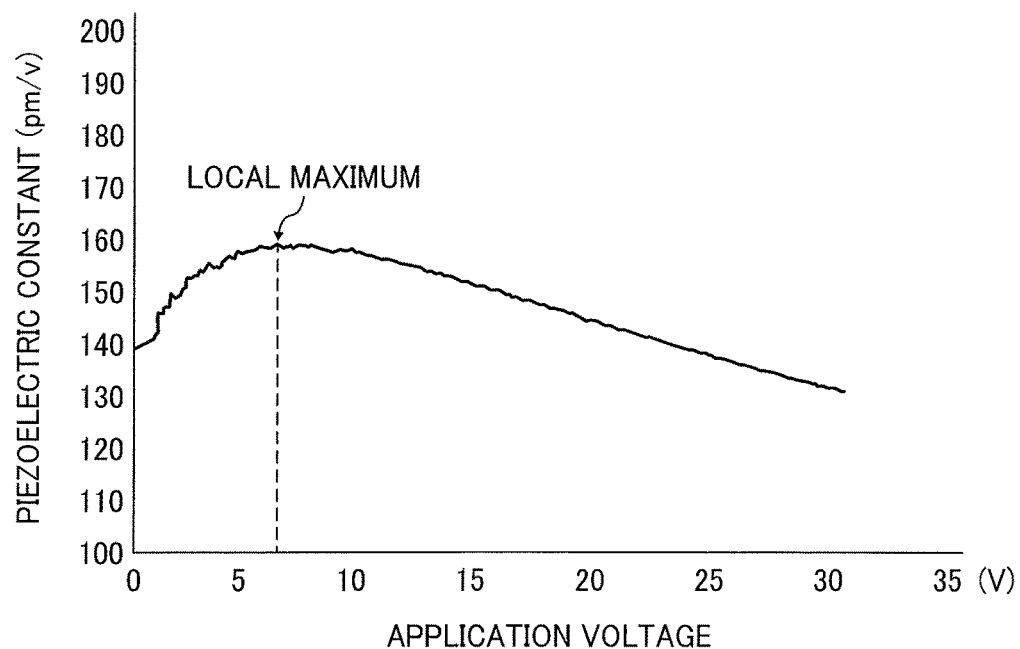
FIG. 27 is an example of a piezoelectric constant profile of a piezoelectric element.

Further, FIG. 27 is an example of the piezoelectric constant profile of the piezoelectric element 202. As indicated in FIG. 27, in one case, the piezoelectric constant of the piezoelectric element 202 becomes a local maximum near the application voltage of 6.5V and then decreases gradually in the range of 0V to 30V. Even if the piezoelectric element 202 such as PZT has this piezoelectric property, the control unit 11 can set the drive voltage with the given difference, which is greater than 0V, and applies the drive voltage to the piezoelectric element 202 to control the moveable devise 13, and based the experiment, the inventors have found that the constantness of the movement speed of the reflector 14 can be enhanced similar to the above described embodiment. This can be occurred by the above described configuration and also the piezoelectric polarization effects of the piezoelectric element 202. When the positive or the negative voltage is applied to the polarization direction of the piezoelectric element, the deformation proportional to the applied voltage level (e.g., expansion and shrinking) occurs, which is known as the inverse piezoelectric effect, which means the piezoelectric element 202 is required to be polarized.

The piezoelectric element 202 may be de-polarized when time elapses after the manufacturing the piezoelectric element 202. Even if the piezoelectric element 202 is depolarized, the piezoelectric element 202 can be re-polarized by applying several voltages. And further, since the re-polarization speed can be very fast, the de-polarization can be ignored when the piezoelectric element 202 is applied with several voltages or more. However, based the experiment, the inventors have found that an effect which may be caused by the de-polarization becomes greater near 0V.

Figure 28:
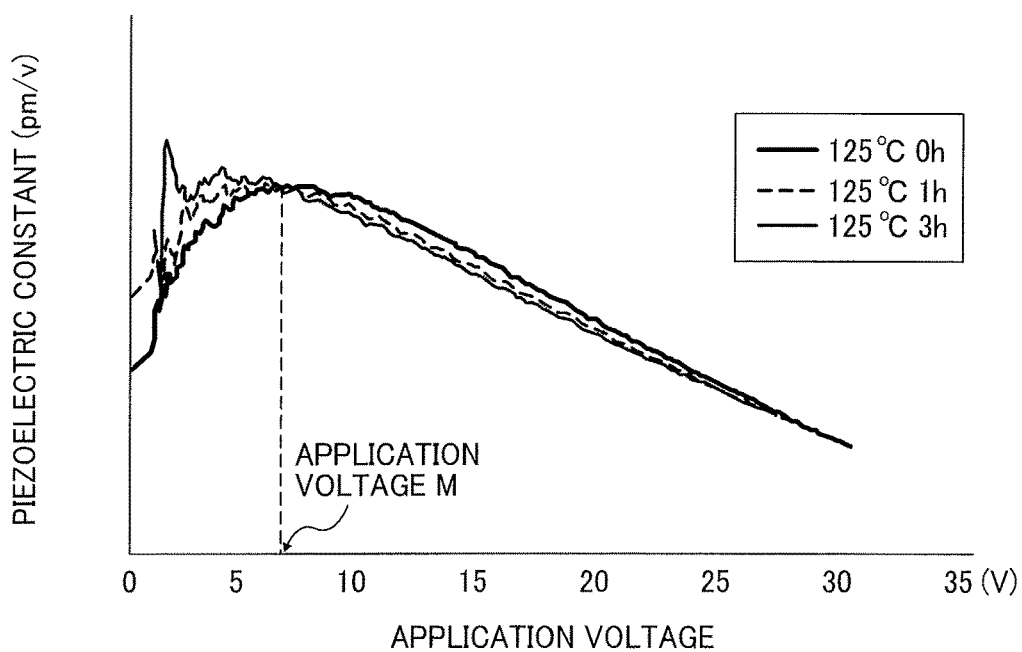
FIG. 28 illustrates an example of piezoelectric constant profiles changing along a time line under different heated conditions.

FIG. 28 illustrates an example of a piezoelectric constant profiles changing along a time line under three heated conditions. The heating condition is used to accerelate the de-polarization speed. An optical deflector used for the experiment of FIG. 28 is the optical deflector that has been used for a given time after manufacturing the optical deflector, which means the de-polarization of the piezoelectric element has been progressed for some level.

After the piezoelectric element was applied with a drive voltage while the piezoelectric element was heated for 0 h, 1 h, and 3 h under the temperature of 125 Celsius degrees, the piezoelectric property was measured for each of the heating conditions. Further, a local maximum M of the application voltage set for the piezoelectric constant profile of 0 h was also set as the local maximum of the application voltage for the piezoelectric constant profile of 1 h and 3 h. When this adjustment is not performed, the piezoelectric constant value becomes smaller as the driving time period becomes longer.

As indicated in FIG. 28, the change of the piezoelectric constant value of the piezoelectric element 202 near 0V to 4.5V along the time line with respect to the local maximum becomes greater than the change of the piezoelectric constant value of the piezoelectric element 202 after 4.5V along the time line with respect to the local maximum. Especially, the change of the piezoelectric constant value of the piezoelectric element in the range of 0V to 2V with respect to the local maximum becomes greater. This may occur because the piezoelectric element manufactured with the polarized condition becomes the de-polarized piezoelectric element when time elapses after manufacturing the piezoelectric element, and the re-polarization may occur to the piezoelectric element when the piezoelectric element is being driven by applying the drive voltage. When several voltages or more is applied, the re-polarization can occur quickly, and thereby the de-polarization effect can be little. However, when the drive voltage is in the lower voltage range such as the drive voltage is near 0V, the re-polarization may proceed slowly, with which the de-polarization effect may become greater when the drive voltage is in the lower voltage range. Therefore, the change of the piezoelectric constant value of the piezoelectric element may become greater in the lower voltage range.

When the voltage range that the de-polarization effect becomes greater is used for the drive voltage, the piezoelectric property changes along the time line of. Therefore, when an initially-set drive voltage is applied to the piezoelectric element, the deformation of the piezoelectric element may not become the expected deformation depending on the driving time, and thereby the constantness of the movement speed of the reflector is affected. If the waveform of the drive voltage is changed depending on the driving time, the control becomes complex. Therefore, by setting the minimum value of the drive voltage greater than 0V with a given difference by the control unit 11, the de-polarization e effect can be suppressed, and thereby constantness of the movement speed of the reflector 14 can be enhanced.

Based on the experiment, the inventors have found that the de-polarization effect becomes greater in the range from 0V to 4.5V, and the de-polarization effect becomes especially greater in the range from 0V to 2V. Therefore, the control unit 11 preferably sets 2V as the given difference of the drive voltage. Further, the control unit 11 further preferably sets 4.5V or more as the given difference of the drive voltage.

Further, based on the experiment, the inventors have found that the change of the piezoelectric constant value of the piezoelectric element becomes greater in the range lower than the application voltage M where the piezoelectric constant profile becomes a local maximum. Therefore, the control unit can set the application voltage M as the given difference of the drive voltage. However, since the depolarization effect is not so great in the range of several voltages from the application voltage M, a voltage 30% or more of the application voltage M (e.g., when the application voltage M is 6.5V for the local maximum of the piezoelectric constant profile, 2V or more) is preferably set as the given difference of the drive voltage. Further, the application voltage 70% or more of the application voltage M (e.g., when the application voltage M is 6.5V for the local maximum of the piezoelectric constant profile, 4.5V or more) is further preferably set as the given difference of the drive voltage. Further, if the given difference of the drive voltage is set too great, the drive voltage for driving the piezoelectric element becomes too high, which may cause damages to the piezoelectric element. Therefore, the given difference of the drive voltage is preferably set, for example, 7V or less.

(Setting of Drive Voltage)

Figure 29:
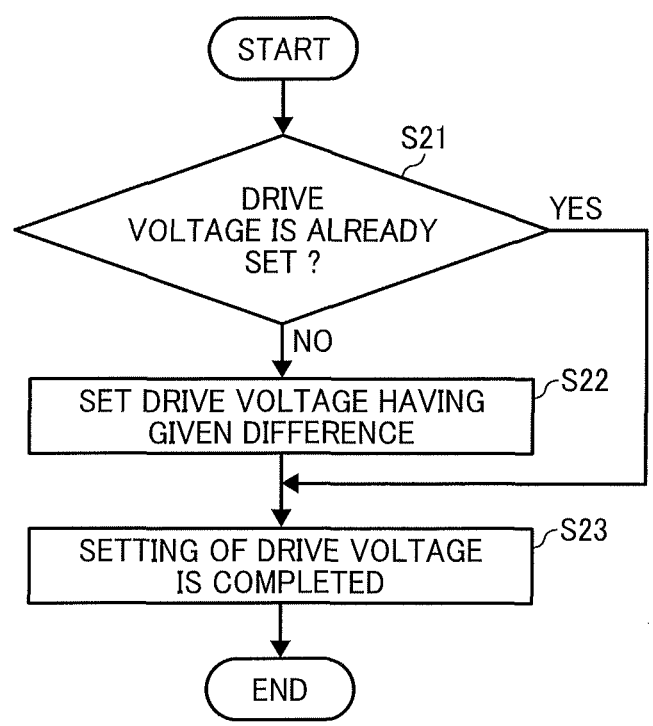
FIG. 29 is a flow chart showing steps of a process of setting a drive voltage.

A description is given of steps of a process setting a drive voltage with reference to FIG. 29, which is a flow chart showing the steps of a process of setting the drive voltage.

At step S21, the control unit 11 checks whether a drive voltage is already set. If step S21 is YES, the sequence proceeds to step S23, and the setting of the drive voltage is completed. If step S21 is NO, the sequence proceeds to step S22. At step S22, the control unit 11 sets the drive voltage having a given difference, in which the drive voltage having a pre-set given difference can be input manually, or the drive voltage having a given difference can be input automatically. The drive voltage having the given difference can be input automatically by performing the followings. Specifically, the piezoelectric constant of the piezoelectric element is stored in a memory in advance, then the piezoelectric constant of the piezoelectric element 202 is read from the memory, then the minimum value of the drive voltage is set for 30% of the application voltage corresponding to a local maximum on the piezoelectric constant profile, and the maximum value of the drive voltage is set by adding 25V to the minimum value. After setting the drive voltage at step S22, the sequence proceeds to step S23. At step S23, the control unit 11 confirms that the drive voltage having the given difference is set, and sets the setting completed flag to ON, and then ends the setting of the drive voltage. By setting the drive voltage in line with the above described steps, the constantness of the movement speed of the reflector 14 can be enhanced.

As to the above described embodiments, the constantness of the movement speed of the reflector can be enhanced.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions. Further, the above described image processing method performable in the image processing apparatus can be described as a computer-executable program, and the computer-executable program can be stored in a ROM or the like in the image processing apparatus and executed by the image processing apparatus. Further, the computer-executable program can be stored in a storage medium or a carrier such as compact disc-read only memory (CD-ROM), digital versatile disc-read only memory (DVD-ROM) or the like for distribution, or can be stored on a storage on a network and downloaded as required.

Numerous additional modifications and variations for the communication terminal, information processing system, and information processing method, a program to execute the information processing method by a computer, and a storage or carrier medium of the program are possible in light of the above teachings. It is therefore to be understood that within the scope of the appended claims, the description of present disclosure may be practiced otherwise than as specifically described herein. For example, elements and/or features of different examples and illustrative embodiments may be combined each other and/or substituted for each other within the scope of present disclosure and appended claims.

What is claimed is:

1. A control unit to control a movement of a reflector, comprising:
a drive signal output unit to apply a drive voltage having a cyclic waveform including a minimum value and a maximum value in each cycle, to a piezoelectric element to deform the piezoelectric element, the deformation of the piezoelectric element causing the reflector to move; and
circuitry to control the drive voltage to have the minimum value greater than a zero voltage that is zero, by a given difference value.

2. The control unit of claim 1, wherein the difference value is set such that a change rate of a piezoelectric constant value of the piezoelectric element relative to application voltage applied to the piezoelectric element, in a cycle of the cyclic waveform of the drive voltage controlled to have the minimum value greater than the zero voltage by the given difference becomes smaller than a change rate of the piezoelectric constant value of the piezoelectric element relative to application voltage applied to the piezoelectric element, in a cycle of the cyclic waveform of the drive voltage controlled to have the minimum value that is the zero voltage.

3. The control unit of claim 2, wherein the given difference is set such that the change rate of the piezoelectric constant value of the piezoelectric element relative to application voltage applied to the piezoelectric element, in a cycle or a half cycle of the cyclic waveform of the drive voltage starting from an application of the drive voltage becomes within 20%.

4. The control unit of claim 2, wherein the given difference is set such that the change rate of the piezoelectric constant value of the piezoelectric element relative to application voltage applied to the piezoelectric element, in a cycle or a half cycle of the cyclic waveform of the drive voltage starting from an application of the drive voltage becomes within 10%.

5. The control unit of claim 2, wherein the given difference is set such that the change rate of the piezoelectric constant value of the piezoelectric element relative to application voltage applied to the piezoelectric element, in a cycle or a half cycle of the cyclic waveform of the drive voltage starting from an application of the drive voltage becomes from 5% to 10%.

6. The control unit of claim 1, wherein the given difference is set to a voltage value smaller than a voltage value where the piezoelectric constant value of the piezoelectric element becomes a local maximum in a cycle of the drive voltage.

7. The control unit of claim 6, wherein the given difference is set with 30% or more of the voltage value where the piezoelectric constant value of the piezoelectric element becomes the local maximum in a cycle of the drive voltage.

8. The control unit of claim 6, wherein the given difference is set with 70% or more of the voltage value where the piezoelectric constant value of the piezoelectric element becomes the local maximum in a cycle of the drive voltage.

9. The control unit of claim 1, wherein the minimum value of the drive voltage is 2 V or more.

10. The control unit of claim 1, wherein the minimum value of the drive voltage is from 4.5V to 7V.

11. The control unit of claim 1,
wherein the piezoelectric element includes a first piezoelectric element and a second piezoelectric element, and
wherein the drive signal output unit applies a first drive voltage having a first waveform to the first piezoelectric element, and a second drive voltage having a second waveform to the second piezoelectric element, and the circuitry sets a first minimum value of the first drive voltage having the first waveform to be different than a second minimum value of the second drive voltage having the second waveform.

12. The control unit of claim 1, wherein the control unit controls a moveable device having the piezoelectric element and the reflector, the piezoelectric element including the first piezoelectric element and the second piezoelectric element,
wherein the drive signal output unit applies a first drive voltage having a first cyclic waveform to the first piezoelectric element, and a second drive voltage having a second cyclic waveform to a second piezoelectric element, the first waveform having a sawtooth waveform having a first rising time and a first falling time in each cycle, and the second waveform having a sawtooth waveform having a second rising time and a second falling time in each cycle,
wherein the circuitry controls a ratio of the first rising time and the cycle of the first drive voltage or a ratio of the second falling time and the cycle of the second drive voltage such that a mechanical resonance frequency of the moveable device matches at least one frequency band of a frequency spectrum of the first drive voltage or one frequency band of a frequency spectrum of the second drive voltage where a higher harmonic wave component becomes low.

13. An optical deflection system comprising:
the control unit of claim 1;
a mirror unit having the reflector; and
a plurality of piezoelectric drivers each having the piezoelectric element,
wherein each of the piezoelectric drivers deforms a corresponding piezoelectric element to move the mirror unit about one axis under a control of the control unit.

14. An image projection apparatus comprising
a light source unit to emit light; and
the optical deflection system of claim 13 to deflect the light emitted from the light source unit and modulated based on image information to scan an image formation face to form an image on the image formation face.

15. A method of controlling a movement of a reflector comprising:
applying a drive voltage having a given waveform with a minimum value and a maximum value to a piezoelectric element;
controlling the drive voltage to have the minimum value greater than a zero voltage by a given difference value; and
applying the drive voltage having the minimum value set greater than the zero voltage to the piezoelectric element to control the movement of the reflector through deforming the piezoelectric element.

* * * * *